(12) United States Patent
Araragi

(10) Patent No.: US 10,511,302 B2
(45) Date of Patent: Dec. 17, 2019

(54) DRIVE CIRCUIT FOR DRIVE TARGET SWITCH

(71) Applicant: DENSO CORPORATION, Kariya, Aichi-pref. (JP)

(72) Inventor: Akifumi Araragi, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/230,558

(22) Filed: Dec. 21, 2018

(65) Prior Publication Data

US 2019/0199343 A1 Jun. 27, 2019

(30) Foreign Application Priority Data

Dec. 26, 2017 (JP) ................................. 2017-250000

(51) Int. Cl.
| | | |
|---|---|---|
| H03K 17/16 | (2006.01) | |
| H02M 1/08 | (2006.01) | |
| H03K 17/06 | (2006.01) | |
| H02P 27/06 | (2006.01) | |
| H02M 7/5387 | (2007.01) | |

(52) U.S. Cl.
CPC ............ *H03K 17/162* (2013.01); *H02M 1/08* (2013.01); *H03K 17/063* (2013.01); *H03K 17/163* (2013.01); *H02M 7/5387* (2013.01); *H02P 27/06* (2013.01); *H03K 2017/066* (2013.01)

(58) Field of Classification Search
None
See application file for complete search history.

(56) References Cited

U.S. PATENT DOCUMENTS

| | | | | |
|---|---|---|---|---|
| 8,531,212 B2 * | 9/2013 | Dewa | ................... | H03K 17/063 327/108 |
| 9,673,812 B2 * | 6/2017 | Takano | ................ | H03K 17/687 |

FOREIGN PATENT DOCUMENTS

WO 2016/030954 A1 3/2016

* cited by examiner

*Primary Examiner* — Jeffery S Zweizig
(74) *Attorney, Agent, or Firm* — Oliff PLC

(57) ABSTRACT

In a drive circuit, a control switch is electrically connected between a negative voltage source and a reference voltage generator. A drive controller switches a discharge switch and a control switch from an off state to an on state to thereby supply a first negative output voltage to a main control terminal of a target switch. The drive controller switches the discharge switch and the control switch from the on state to the off state to thereby change the first negative output voltage to be supplied to the main control terminal of the target switch to a second negative voltage based on the reference voltage generated by the reference voltage generator. The second negative voltage is more positive than the first negative voltage.

15 Claims, 11 Drawing Sheets

FIG.3A
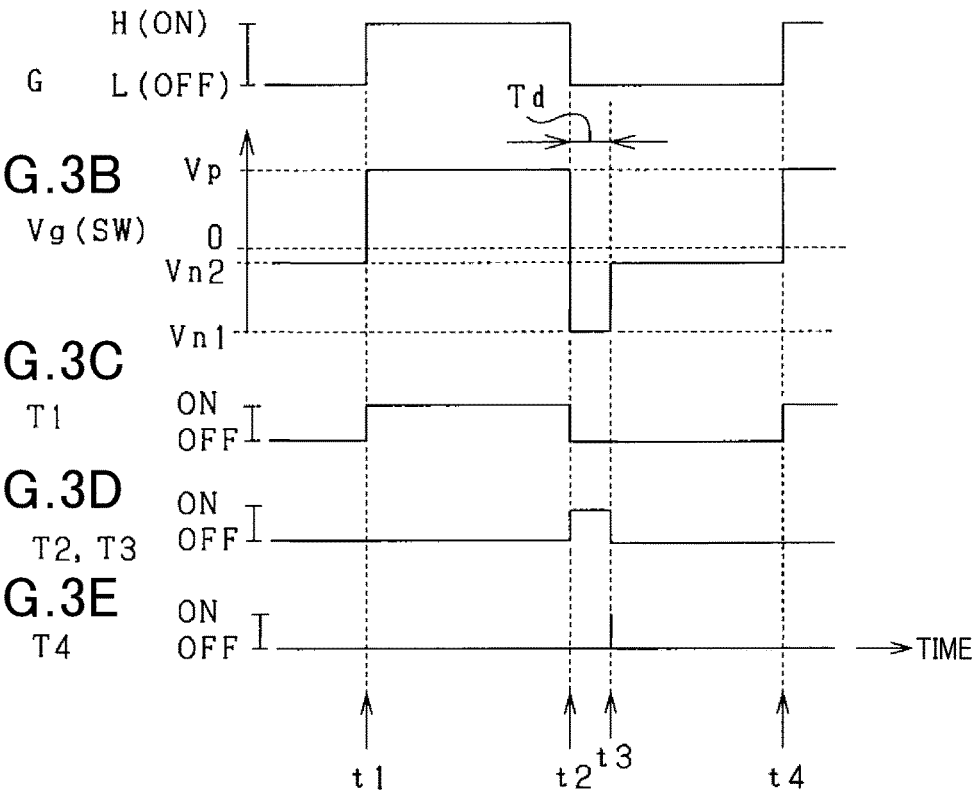
FIG.3B
FIG.3C
FIG.3D
FIG.3E
FIG.4
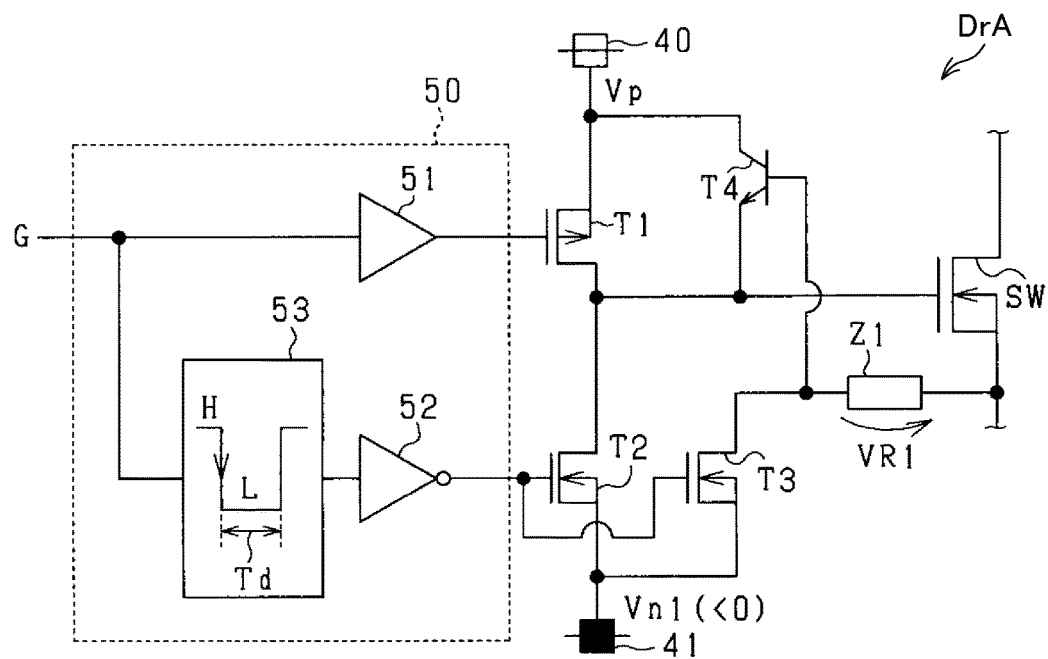

FIG.13
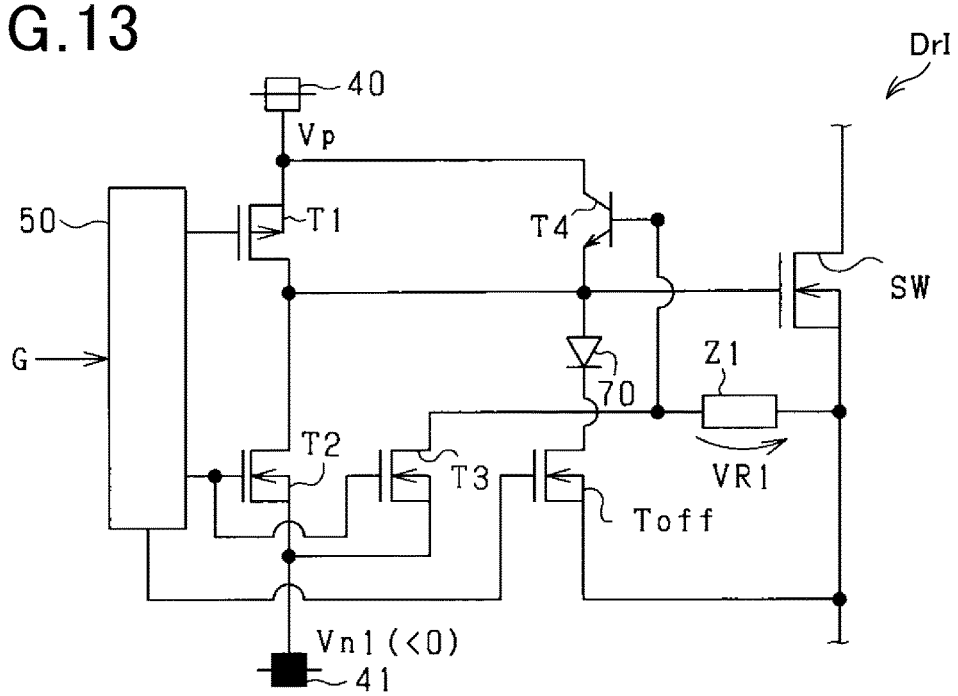
FIG.14A
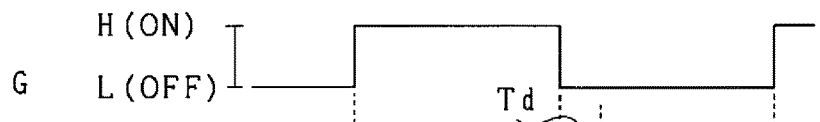
FIG.14B
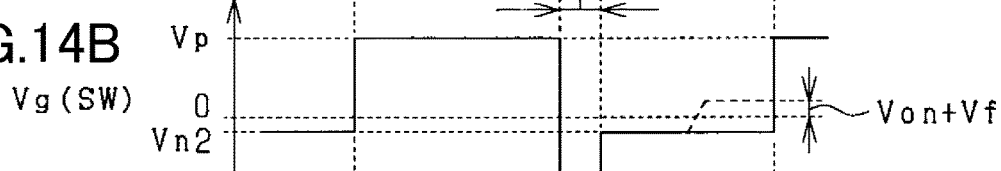
FIG.14C
T1
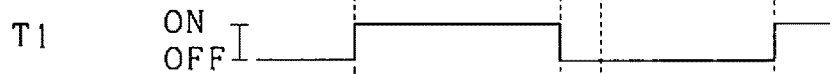
FIG.14D
T2, T3
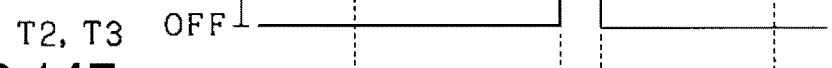
FIG.14E
T4
FIG.14F
Toff

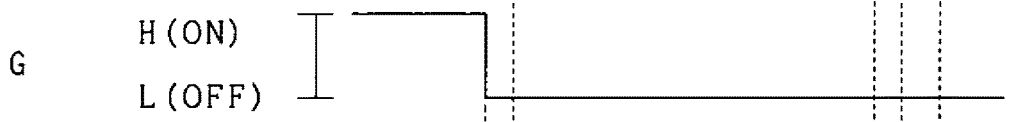
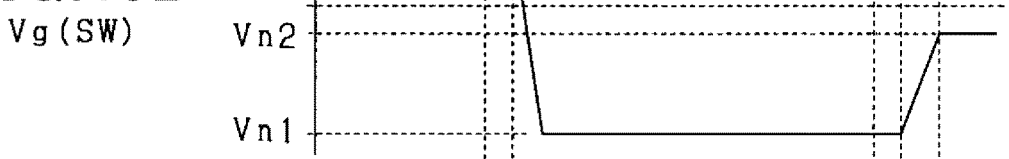
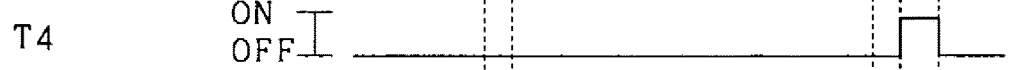
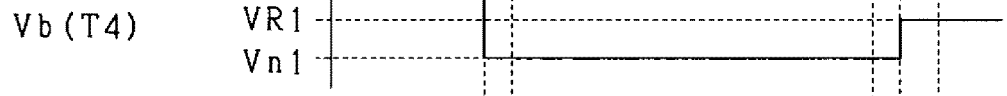
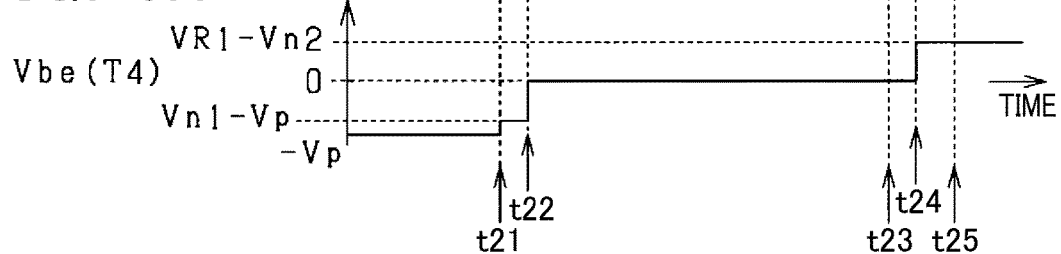

DRIVE CIRCUIT FOR DRIVE TARGET SWITCH

CROSS REFERENCE TO RELATED APPLICATION

This application is based on and claims the benefit of priority from Japanese Patent Applications No. 2017-250000 filed on Dec. 26, 2017, the disclosures of which are incorporated in their entireties herein by reference.

TECHNICAL FIELD

The present disclosure relates to drive circuits for a drive target switch.

BACKGROUND

There are switches each having a first main terminal, a second main terminal, and a main control terminal, such as MOSFETs or IGBTs. Such a switch is turned on when a potential difference of the main control terminal relative to the second main terminal becomes equal to or higher than a threshold voltage; the on state of the switch allows a current to flow between the first and second main terminals. In contrast, the switch is turned off when the potential difference of the main control terminal relative to the second main terminal becomes lower than the threshold voltage; the off state of the switch prevents a current from flowing between the first and second main terminals.

Such a switch has a feedback capacitance formed between the first main terminal and the main control terminal. While the switch is in the off state, electrical charge is supplied to the main control terminal via the feedback capacitance. This may result in the potential difference of the main control terminal relative to the second main terminal becomes equal to or higher than the threshold voltage. This therefore may result in self-turn-on of the switch; the self-turn-on of the switch causes the switch to be erroneously switched from the off state to the on state although the switch should be maintained in the off state.

For addressing this issue, PCT International Publication No. 2016/030954 discloses a drive circuit that applies a negative voltage to the main control terminal of a target switch to thereby reduce the occurrence of self-turn-on of the switch. Specifically, the drive circuit disclosed in the published patent document includes first and second switches each being an N-channel MOSFET, and a third switch being a P-channel MOSFET. The drive circuit also includes a first negative voltage source that outputs a first negative voltage, such as −15 V, and a second negative voltage source that outputs a second negative voltage, such as −5V, that is higher than the first negative voltage. Note that, in this specification, "lower" means "more negative" when applied to a negative voltage, and "higher" means less negative or more positive.

The drive circuit is configured to selectively apply the first and second negative voltages to the main control terminal of the target switch to thereby prevent self-turn-on of the target switch. This configuration aims to retard deterioration of the target switch due to continuous application of a large voltage to the main control terminal of the target switch.

The following further describes the drive circuit disclosed in the published patent document. The source of the first switch is connected to the first negative voltage source, and the drain of the first switch is connected to the main control terminal of the target switch. The drain of the second switch is connected to the main control terminal of the target switch, and the source of the second switch is connected to the drain of the third switch. The source of the third switch is connected to the second negative voltage source. While the first switch is in the on state, the intrinsic diode of the third switch prevents interference between the first and second negative voltage sources.

SUMMARY

The drive circuit disclosed in the published patent document is essentially comprised of the first to third switches and the first and second negative voltage sources for switching between the first and second negative voltages while preventing their interference. The drive circuit disclosed in the published patent document needs to control on-off switching operations of each of the first to third switches. This may result in the drive circuit having many components and a complicated control configuration.

From this viewpoint, one aspect of the present disclosure seeks to provide drive circuits for a target switch, each of which is capable of addressing the issue set forth above.

Specifically, an alternative aspect of the present disclosure aims to provide such drive circuits, each of which is designed to have a smaller number of components and a simpler configuration.

According to an exemplary aspect of the present disclosure, there is provided a drive circuit for turning on or off a target switch having a first main terminal, a second main terminal with a predetermined voltage, and a main control terminal. The drive circuit includes a negative power source configured to output a first negative voltage lower than the predetermined voltage at the second main terminal, a discharge switch electrically connected between the main control terminal and the negative voltage source, and a reference voltage generator connected to the second main terminal and configured to generate, based on the predetermined voltage at the second main terminal, a reference voltage that is higher than the first negative voltage of the negative power source and that is lower than the predetermined voltage at the second main terminal. The drive circuit also includes a control switch electrically connected between the negative voltage source and the reference voltage generator, and a drive controller. The drive controller is configured to switch the discharge switch and the control switch from an off state to an on state to thereby supply the first negative voltage to the main control terminal of the target switch, and switch the discharge switch and the control switch from the on state to the off state to thereby change the first negative voltage to be supplied to the main control terminal of the target switch to a second negative voltage based on the reference voltage generated by the reference voltage generator. The second negative voltage being higher than the first negative voltage.

The drive circuit according to the exemplary aspect has a simpler structure of the discharge switch and the control switch, the negative voltage source, and the reference voltage generator, and switchably applies one of the first and second negative voltages to the main control terminal the target switch based on the simpler structure In particular, this configuration enables one of the negative output voltage and the reference voltage to be selectively applied to the main control terminal of the target switch based on the simpler structure without using different negative power sources and elements to prevent interference between the different negative power sources. The drive circuit therefore has a smaller number of components, a simpler configuration, and a simpler control procedure required to perform the selective negative voltage application to the main control terminal of the target switch.

BRIEF DESCRIPTION OF THE DRAWINGS

Other aspects of the present disclosure will become apparent from the following description of embodiments with reference to the accompanying drawings in which:

FIGS. 3A to 3E are a joint timing chart schematically illustrating a drive routine of a target switch according to the first embodiment;

FIG. 4 is a circuit diagram schematically illustrating an example of the structure of a drive circuit for each switch according to a first modification of the first embodiment;

FIG. 13 is a circuit diagram schematically illustrating an example of the structure of a drive circuit for each switch according to the eighth embodiment of the present disclosure;

FIGS. 14A to 14F are a joint timing chart schematically illustrating a drive routine of a target switch according to the eighth embodiment;

FIGS. 19A to 19H are a joint timing chart schematically illustrating a drive routine of a target switch according to the tenth embodiment;

DETAILED DESCRIPTION OF EMBODIMENT

Figure 1:
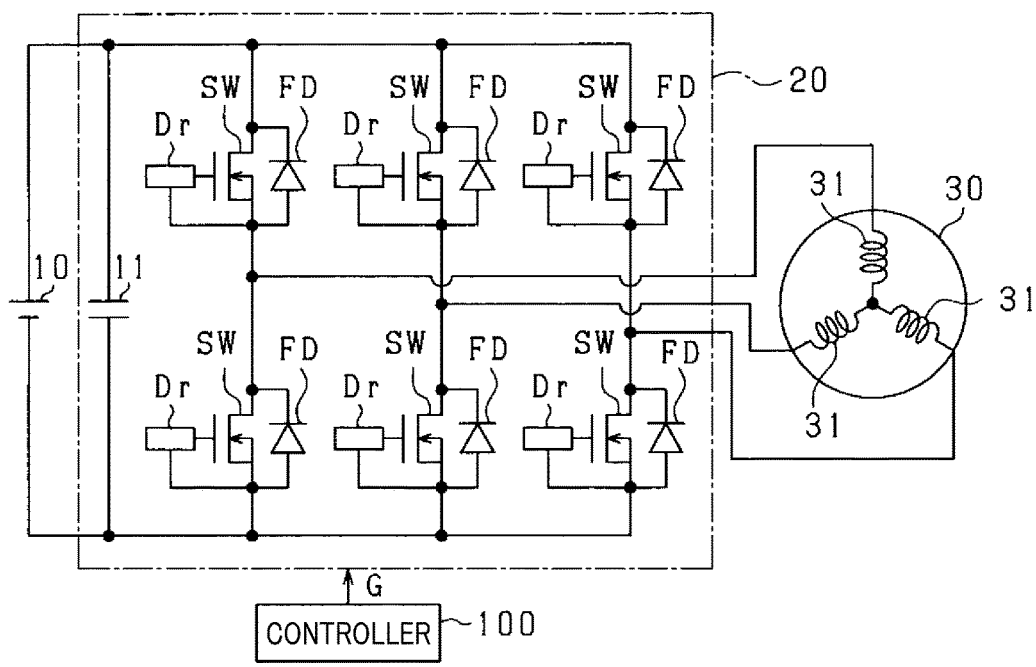
FIG. 1 is a circuit diagram schematically illustrating an example of the overall structure of a control system for a rotary electric machine according to the first embodiment of the present disclosure.

The following describes embodiments of the present disclosure with reference to the accompanying drawings. In the embodiments, like parts between the embodiments, to which like reference characters are assigned, are omitted or simplified to avoid redundant description.

First Embodiment

The following describes the first embodiment of the present disclosure with reference to FIGS. 1 to 6. The first embodiment is configured such that drive circuits Dr according to the present disclosure are applied to a control system CS for a motor-generator 30.

Referring to FIG. 1, the control system CS includes a battery 10 serving as a direct-current (DC) power source, an inverter 20, the motor-generator 30, the drive circuits Dr, and a controller 100.

The motor-generator 30 is electrically connected to the battery 10 via the inverter 20. The first embodiment uses a permanent magnet synchronous three-phase motor-generator as the motor-generator 30. In particular, the motor-generator 30 includes a rotor having permanent magnets, and a stator having a stator core and three-phase stator coils 31. In particular, the motor-generator 30 is capable of rotating the rotor having the permanent magnets based on magnetic interactions between the permanent magnets of the rotor and a rotating magnetic field generated by the three-phase stator coils 31 of the stator. Each of the three-phase stator coils 31 has opposing first and second ends. The stator can be configured such that each of the three-phase stator coils 31 is wound in and around the stator core in concentrated or distributed configuration.

The control system CS also includes a smoothing capacitor 11 connected in parallel to the battery 10.

The inverter 10 includes three (UVW)-phase upper- and lower-arm switches SW; each switch SW serves as, for example, a target switch.

The upper- and lower-arm switches SW for the U-phase are connected to each other in series. Similarly, the upper- and lower-arm switches SW for the V-phase are connected to each other in series, and the upper- and lower-arm switches SW for the W-phase are connected to each other in series.

The connection point between the upper- and lower-arm switches SW for the U-phase is connected to the first end of the U-phase stator coil 31. Similarly, the connection point between the upper- and lower-arm switches SW for the V-phase is connected to the first end of the V-phase stator coil 31, and the connection point between the upper- and lower-arm switches SW for the W-phase is connected to the first end of the W-phase stator coil 31. The second ends of the U-, V-, and W-phase coils 31 are connected to a common junction, i.e. a neutral point, in, for example, a star-configuration.

The first embodiment uses voltage-controlled semiconductor switches as an example of Si or SiC devices, as the respective switches SW. Specifically, the first embodiment uses Si or SiC N-channel MOSFETs as the respective switches SW. The drain of each switch SW serves as, for example, a first main terminal, the source of each switch SW serves as, for example, a second main terminal, and the gate of each switch SW serve as, for example, a main control terminal. Each of the switches SW includes an intrinsic diode FD incorporated therein such that its cathode is connected to the drain, and its anode is connected to the source. Each of the switches SW can include an additional flyback, i.e. free-wheeling, diode connected in antiparallel thereto.

The drive circuits Dr are provided for the respective switches SW. Each drive circuit Dr is connected to the second main terminal and the main control terminal of the corresponding switch SW, and is operative to turn on or off the corresponding switch SW in accordance with a corresponding drive signal G sent from the controller 100.

The controller 100 causes each drive circuit Dr to alternately turn on the upper- and lower-arm switches SW for each phase to thereby control a controlled variable, such as torque, of the motor-generator 30 to a commanded value or a requested value.

Specifically, the controller 100 cyclically generates, as the drive signal G for each switch SW, an on command or an off command, and cyclically sends the on command or off command to each drive circuit Dr of the corresponding switch SW; the on command has a logical high level (H), and instructs each drive circuit Dr to turn on the corresponding switch SW, and the off command has a logical low level (L), and instructs each driver Dr to turn off the corresponding switch SW.

Figure 2:
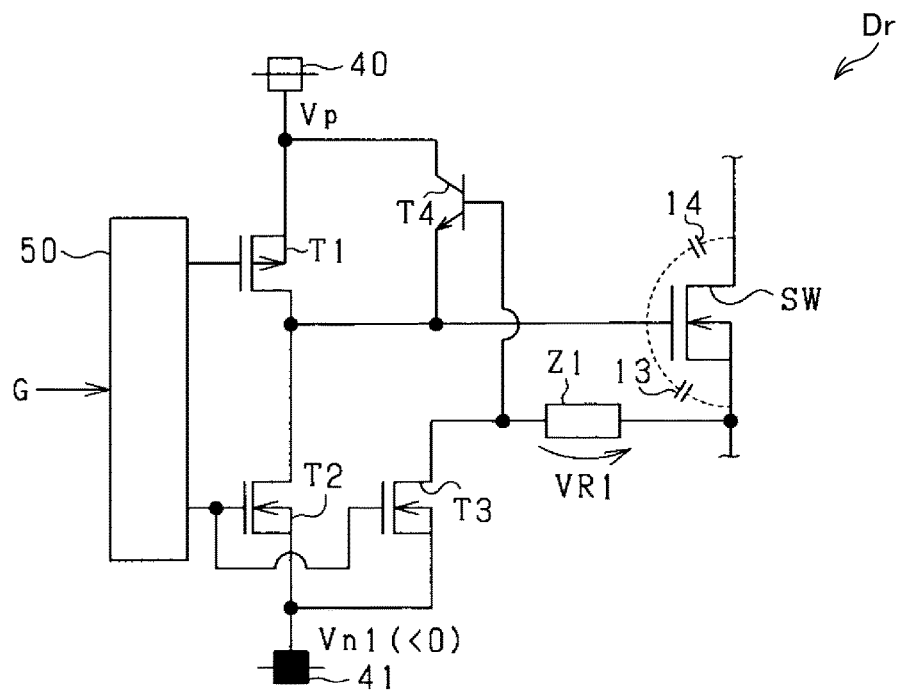
FIG. 2 is a circuit diagram schematically illustrating an example of the structure of a drive circuit for each switch illustrated in FIG. 1.

Next, the following describes an example of the structure of each drive circuit Dr for the corresponding switch SW with reference to FIG. 2. The drive circuits Dr for the respective switches SW basically have a common structure. For this reason, the following describes the structure of the drive circuit Dr for the U-phase upper-arm switch SW, which will be referred to simply as a target switch SW, as a typical example.

Note that, in FIG. 2, the target switch SW has an equivalent gate capacitance 13 related to an input capacity of the target switch SW, and a feedback capacitance 14 formed between the second main terminal and the main control terminal thereof.

Referring to FIG. 2, the drive circuit Dr includes a positive voltage source 40, a negative voltage source 41, a drive controller 50, a first switch T1 serving as a charge switch, and a second switch T2 serving as a discharge switch. The first embodiment uses a P-channel MOSFET as the first switch T1, and a N-channel MOSFET as the second switch T2. The target switch SW according to the first embodiment has a potential at the source being set to 0 volts (V). An output voltage of the positive voltage source 40, which is larger than 0V, will be referred to as Vp, and a first negative voltage as the output voltage of the negative voltage source 41, which is smaller than 0 V, will be referred to as Vn1.

The positive voltage source 40 is connected to the source of the first switch T1, and the gate of the target switch SW is connected to the drain of the first switch T1. The drain of the second switch T2 is connected to the gate of the target switch SW, and the negative voltage source 41 is connected to the source of the second switch T2.

The drive circuit Dr also includes a third switch T3 serving as, for example, a control switch, a fourth switch T4 serving as, for example, a supply switch, and a reference voltage generator Z1. The first embodiment uses an N-channel MOSFET as the third switch T3, and an NPN transistor as the fourth switch T4. The collector of the fourth switch T4 serves as, for example, a first sub terminal, the emitter of the fourth switch T4 serves as, for example, a second sub terminal, and the base of the fourth switch T4 serves as, for example, a sub control terminal.

The positive voltage source 40 is connected to the collector of the fourth switch T4, and the gate of the target switch SW is connected to the emitter of the fourth switch T4. The reference voltage generator Z1 has opposite first and second connection terminals, and the source of the target switch SW is connected to the first connection terminal of the reference voltage generator Z1. The base of the fourth switch T4 and the drain of the third switch T3 are connected to the second connection terminal of the reference voltage generator Z1.

The fourth switch T4 serves as, for example, a supply switch according to the first embodiment.

The reference voltage generator Z1 is configured to generate, based on a voltage supplied to the first connection terminal, a reference voltage Vref supplied to the base of the fourth switch T4. The reference voltage Vref is set to be higher than, i.e. more positive, the output voltage of the negative voltage source 41 and lower than, i.e. more negative, the source voltage of the target switch SW. The reference voltage generator Z1 according to the first embodiment is comprised of, for example, a diode or a Zener diode. If the reference voltage generator Z1 is comprised of a diode or a Zener diode, the cathode of the diode or Zener diode serves as, for example, the first connection terminal, and the anode thereof serves as, for example, the second connection terminal.

The drive controller 50 is configured to control on-off switching operations of each of the first to third switches T1, T2, and T3 in accordance with the gate drive voltage G for the target switch SW from the controller 100.

The drive controller 50 is comprised of, for example, a microcomputer including a CPU, a memory, and a peripheral circuit. At least part of all functions provided by the drive controller 100 can be implemented by at least one processor; the at least one processor can be comprised of (1) The combination of at least one programmed processing unit, i.e. at least one programmed logic circuit, and at least one memory (2) At least one hardwired logic circuit (3) At least one hardwired-logic and programmed-logic hybrid circuit The following describes a drive routine of the target switch SW carried out by the drive controller 50 with reference to FIGS. 3A to 3E.

FIG. 3A schematically illustrates how the drive signal G changes over time, FIG. 3B schematically illustrates how a gate voltage Vg of the target switch SW changes over time, and FIG. 3C schematically illustrates how the first switch T1 is driven over time. FIG. 3D schematically illustrates how each of the second and third switches T2 and T3 is driven over time, and FIG. 3E schematically illustrates how the fourth switch T4 is driven over time. Note that the gate voltage Vg represents a potential difference of the gate of the target switch SW relative to the source of the target switch SW, and the gate voltage Vg takes a positive value when the potential at the gate of the target switch SW is higher than the potential at the source of the target switch SW.

Referring to FIGS. 3A to 3E, the drive signal G sent from the controller 100 is changed from the off command to the on command at time t1. Upon determining that the drive signal G is the on command at the time t1, the drive controller 50 performs a charging task to thereby turn on the first switch T1 while maintaining off the second and third switches T2 and T3. This charging task causes the output voltage Vp of the positive voltage source 40 to be supplied to the gate of the target switch SW. This causes the positive voltage source 40 to output a charging current to the gate of the target switch SW via the first switch T1, resulting in the gate voltage Vg being equal to or higher than a threshold voltage Vth. This results in the target switch SW being switched from the off state to the on state, enabling a current to flow through the drain and source of the target switch SW.

The drive controller 50 maintains on the first switch T1 while maintaining off the second and third switches T2 and T3 during the period from the time t1 to time t2.

During the period from the time t1 to the time t2, the reference voltage generator Z1 supplies the negative voltage to the base of the four switch T4, and the positive voltage source 40 supplies the output voltage Vp to the emitter of the fourth switch T4. This results in the potential at the emitter of the fourth switch T4 being higher than the potential at the base of the fourth switch T4, so that the fourth switch T4 is reverse-biased. This causes the fourth switch T4 to be in the off state during the period from the time t1 to the time t2 to prevent a current from flowing from the positive voltage source 40 to the source of the target switch SW via the fourth switch T4 and the reference voltage generator Z1.

The drive signal G sent from the controller 100 is changed from the on command to the off command at the time t2. Upon determining that the drive signal G is the off command at the time t2, the drive controller 50 performs a discharging task to thereby turn off the first switch T1 while synchronously turning on the second and third switches T2 and T3. This discharging task causes the first negative voltage Vn1 of the negative power source 41 to be supplied to the gate of the target switch SW. This causes a discharging current to be discharged from the gate of the target switch SW, resulting in the gate voltage Vg being lower than the threshold voltage Vth. This results in the target switch SW being switched from the on state to the off state. Applying the negative voltage to the gate of the target switch SW prevents the target switch SW from the occurrence of self-turn-on of the target switch SW.

While the first switch T1 is in the off state with the second and third switches T2 and T3 being in the on state, the first negative voltage Vn1 of the negative power source 41 is supplied to the emitter and base of the fourth switch T4. This enables the fourth switch T4 to be maintained in the off state.

The drive controller 50 maintains off the first switch T1 while maintaining on the second and third switches T2 and T3 during the period from the time t2 to time t3.

When a predetermined time Td has elapsed at the time t3 since the timing t2 at which the drive signal G was turned from the on command to the off command, the drive controller 50 synchronously switches the second and third switches T2 and T3 from the on state to the off state.

When the second and third switches T2 and T3 are switched from the on state to the off state, the potential at the emitter of the fourth switch T4 is maintained at the first negative voltage Vn1, and the potential at the base of the fourth switch T4 becomes lower by a voltage drop VR1, which is a positive value, across the reference voltage generator Z1. This results in the potential at the base of the fourth switch T4 being higher than the potential at the emitter of the fourth switch T4, so that the fourth switch T4 is forward-biased. This causes the fourth switch T4 to be switched from the off state to the on state.

The fourth switch T4, which is switched from the off state to the on state at the time t3, causes charge based on the output voltage Vp of the positive voltage source 40 to be supplied to the gate of the switch SW. This results in charge based on the output voltage Vp of the positive voltage source 40 and charge based on the reference voltage generator Z1 being continuously supplied to the gate of the target switch SW until the gate voltage Vg increases up to a second negative voltage Vn2 lower than 0 V. The second negative voltage Vn2 is set to be higher than the first negative voltage Vn1 and lower than the potential at the source of the target switch SW.

If the base-emitter voltage of the fourth switch T4 will be referred to as VF, which is greater than 0 V, the second negative voltage Vn2 is expressed by the following equation (eq0):

$$Vn2 = -VR1 - VF \quad \text{(eq0)}$$

When the gate voltage Vg has reached the second negative voltage Vn2, the fourth switch T4 is switched from the on state to the off state.

During the period from the time t3 to time t4, the drive controller 50 maintains the second to fourth switches T2, T3, and T4 in the off state, thus maintaining the gate voltage Vg in the second negative voltage Vn2.

At the time t4, the drive signal G is changed from the off command to the on command, so that the drive controller 50 is programmed to repeat the above operations from the time t1 to the time t4.

As described above, the drive circuit Dr according to the first embodiment is configured to (1) Have a simpler structure of the second and third switches T2 and T3, the negative voltage source 41, and the reference voltage generator Z1

(2) Switchably apply one of the first negative voltage Vn1 and the second negative voltage Vn2 to the gate of the target switch SW based on the simpler structure In particular, this configuration enables one of the first negative voltage Vn1 and the second negative voltage Vn2 to be selectively applied to the gate of the target switch SW based on the simpler structure without using different negative power sources and elements to prevent interference between the different negative power sources. The drive circuit Dr therefore has a smaller number of components, a simpler configuration, and a simpler control procedure required to perform the selective negative-voltage application to the gate of the target switch SW.

First Modification of the First Embodiment

The following describes a first modification of the first embodiment. FIG. 4 schematically illustrates each drive circuit DrA according to the first modification. The structures and/or functions of the drive circuit DrA according to the first modification are different from those of the drive circuit Dr according to the first embodiment by the following points. So, the following mainly describes the different points, and omits or simplifies descriptions of like parts between the first embodiment and first modification, to which identical or like reference characters are assigned, thus eliminating redundant description.

The drive circuit DrA includes a drive circuit 50A, and the drive circuit 50A includes a first driver 51, a second driver 52, and a timer circuit 53. To the first driver 51 and the timer circuit 53, the drive signal G sent from the controller 100 is input. An output of the timer circuit 53 is input to the second driver 52. The second driver 52 is configured to output, to the gate of each of the second and third switches T2 and T3, a logic inversion signal whose logical level corresponds to an inverted logical level of the output signal of the timer circuit 53.

The first driver 51 is configured to output a logical high-level signal to the gate of the first switch T1 during the logical high-level on command of the drive signal G being input thereto. This enables the first switch T1 to be turned on. In contrast, the first driver 51 is configured to output a logical low-level signal to the gate of the first switch T1 during the logical low-level off command of the drive signal G being input thereto. This enables the first switch T1 to be turned off.

The timer circuit 53 is configured to start measuring of time upon the drive signal G input thereto falling down from the high level to the low level as a trigger. The timer circuit 53 is configured to continuously output the logical low-level signal to the second driver 52 until the measured time reaches the predetermined time Td. This therefore causes the second driver 52 to output the logical high-level signal to the gate of each of the second and third switches T2 and T3. This results in the second and third switches T2 and T3 being in the on state during the period for which the measured time has reached the predetermined time t2 since the start of measuring time by the timer circuit 53.

Upon the measured time reaching the predetermined time Td, the timer circuit 53 is configured to invert the logical level of the output signal from the low level to the high level. This causes the second driver 52 to output the logical low-level signal to the gate of each of the second and third switches T2 and T3. This causes the second and third switches T2 and T3 to be switched from the on state to the off state at the timing when the predetermined time Td has elapsed since the start of measuring time by the timer circuit 53.

As described above, the drive circuit DrA according to the first modification is configured to (1) Turn on the second and third switches T2 and T3 in synchronization with change of the gate signal G from the on command to the off command, and start counting time from the turn-on timing of the second and third switches T2 and T3

(2) Maintain the second and third switches T2 and T3 in the on state until the counted time reaches the predetermined time Td to thereby apply the first negative voltage Vn1 to the gate of the target switch SW (3) Turn off the second and third switches T2 and T3 at the timing when the predetermined time Td has elapsed since the turn-on timing of the second and third switches T2 and T3 to thereby apply the second negative voltage Vn2 to the gate of the target switch Sw This configuration therefore makes it possible to switchably apply one of the first negative voltage Vn1 and the second negative voltage Vn2 to the gate of the target switch SW based on the simpler structure of the drive circuit DrA.

The first modification of the first embodiment therefore achieves the same benefits as those achieved by the first embodiment.

Second Modification of the First Embodiment

Figure 5:
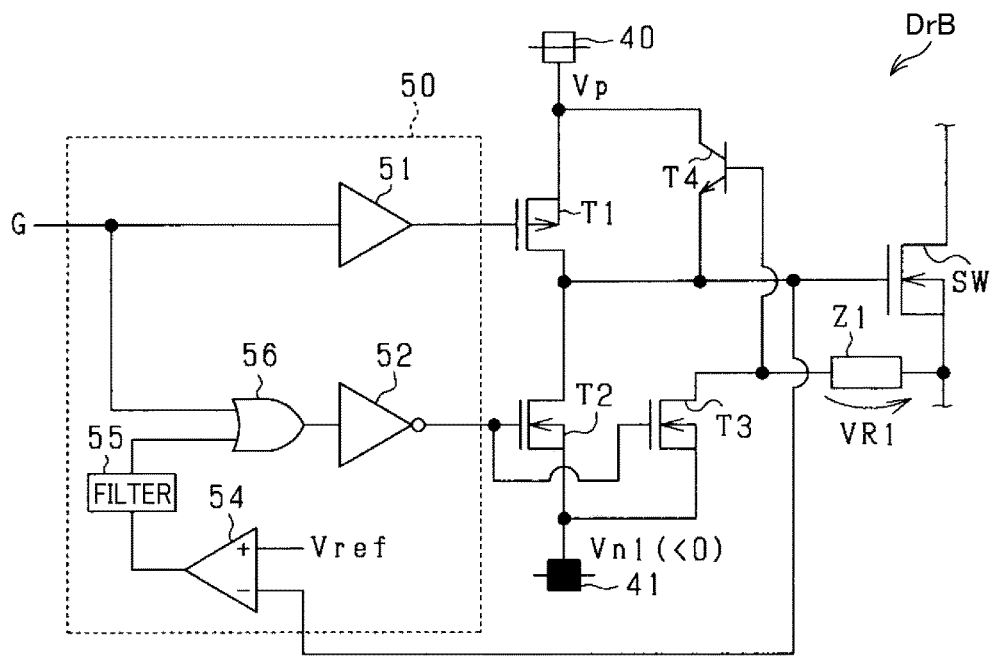
FIG. 5 is a circuit diagram schematically illustrating an example of the structure of a drive circuit for each switch according to a second modification of the first embodiment.
Figure 6A:
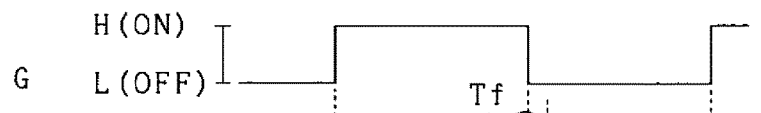
FIGS. 6A to 6E are a joint timing chart schematically illustrating a drive routine of a target switch according to the second modification of the first embodiment.
Figure 6B:
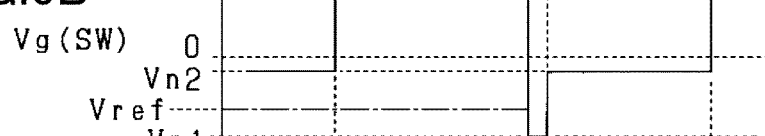
Figure 6C:
Figure 6D:
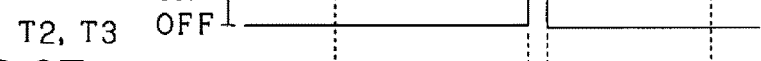
Figure 6E:
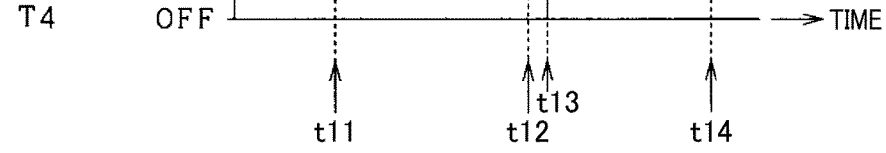

The following describes a second modification of the first embodiment. FIG. 5 schematically illustrates each drive circuit DrB according to the second modification. The structures and/or functions of the drive circuit DrB according to the second modification are different from those of the drive circuit DrA according to the first modification by the following points. So, the following mainly describes the different points, and omits or simplifies descriptions of like parts between the first and second modifications, to which identical or like reference characters are assigned, thus eliminating redundant description.

The drive circuit DrB includes a drive circuit 50B, and the drive circuit 50B includes the first driver 51, the second driver 52, a comparator 54, a filter 55, and an OR circuit 56.

The comparator 54 has a non-inverting input terminal, an inverting input terminal, and an output terminal. The gate voltage Vg of the target switch SW is configured to be input to the non-inverting input terminal of the comparator 54. The reference voltage Vref is configured to be input to the inverting input terminal of the comparator 54. As described above, the reference voltage Vref is set to be higher than the output voltage of the negative voltage source 41 and lower than the source voltage of the target switch SW, i.e. 0 V.

The output terminal of the comparator 54 is connected to the filter 55, so that the filter 55 is configured to (1) Determine whether the logical level of the output signal of the comparator 54 has been unchanged, i.e. non-inverted, for a predetermined filter time Tf (2) Transmit, to the OR circuit 56, an output signal having a logical level indicative of the logical level of the output signal of the comparator 54 upon determining that the logical level of the output signal of the comparator 54 has been unchanged for the filter time Tf The filter time Tf is set to be shorter than the predetermined time Td. The filter 55 aims to prevent the second and third switches T2 and T3 from erroneously operating.

To the OR circuit 56, the drive signal G is also input. The OR circuit 56 is configured to output a logical OR signal of the output signal of the filter 55 and the drive signal G to the second driver 52.

The following describes a drive routine of the target switch SW carried out by the drive controller 50 according to the second modification with reference to FIGS. 6A to 6E. FIGS. 6A to 6E respectively correspond to FIGS. 3A to 3E.

Referring to FIGS. 6A to 6E, the drive signal G sent from the controller 100 is changed from the off command to the on command at time t11. Upon determining that the drive signal G is the on command at the time t11, the output signal of the OR circuit 56 is maintained at the logical high level, so that the output signal of the second driver 52 is maintained at the logical low level. This results in the first switch T1 being turned on while the second and third switches T2 and T3 are maintained in the off state.

The drive controller 50B maintains on the first switch T1 while the second and third switches T2 and T3 are maintained off during the period from the time t11 to time t12, because the output of the OR circuit 56 is maintained at the logical high level.

The drive signal G sent from the controller 100 is changed from the on command to the off command at the time t12. This causes the output signal of the OR circuit 56 to be switched from the logical high level to the logical level, because both the gate signal G input to the OR circuit 56 and the output signal of the filter 55 input to the OR circuit 56 have the logical low level. This causes the output signal of the second driver 52 to be switched from the logical low level to the logical high level, resulting in the second and third switches T2 and T3 being switched from the off state to the on state at the time t12.

The switching of the drive signal G from the on command to the off command at the time t12 also causes the gate voltage Vg of the target switch SW to decrease. When the gate voltage Vg becomes lower than the reference voltage Vr, the logical level of the output of the comparator 54 is inverted from the logical low level to the logical low level.

When the logical high level (H) of the output signal of the comparator 54 has been unchanged, i.e. non-inverted for the predetermined filter time Tf, the filter 55 changes its output signal from the logical low level (L) to the logical high level (H) indicative of the logical high level (H) of the output signal of the comparator 54 at time t13. This causes the output signal of the OR circuit 56 to be switched from the logical low level to the logical high, because the output signal of the filter 55 input to the OR circuit 56 has the logical high level. This causes the output signal of the second driver 52 to be switched from the logical high level to the logical low level, resulting in the second and third switches T2 and T3 being switched from the on state to the off state at the time t13.

As described above, the drive circuit DrB according to the second modification is configured to (1) Turn on the second and third switches T2 and T3 in synchronization with change of the gate signal G from the on command to the off command (2) Maintain the second and third switches T2 and T3 in the on state during the filter time Tf set to be shorter than the predetermined time Td (3) Turn off the second and third switches T2 and T3 at the end of the filter time Tf to thereby apply the second negative voltage Vn2 to the gate of the target switch Sw This configuration therefore makes it possible to switchably apply one of the first negative voltage Vn1 and the second negative voltage Vn2 to the gate of the target switch SW based on the simpler structure of the drive circuit DrB.

The second modification of the first embodiment therefore achieves the same benefits as those achieved by the first embodiment.

In particular, the second modification makes it possible to reduce the period Tf for which the first negative voltage Vn1 has been applied to the gate of the target switch SW as compared with the period Td for which the first negative voltage Vn1 has been applied to the gate of the target switch SW according to the first embodiment.

Second Embodiment

Figure 7:
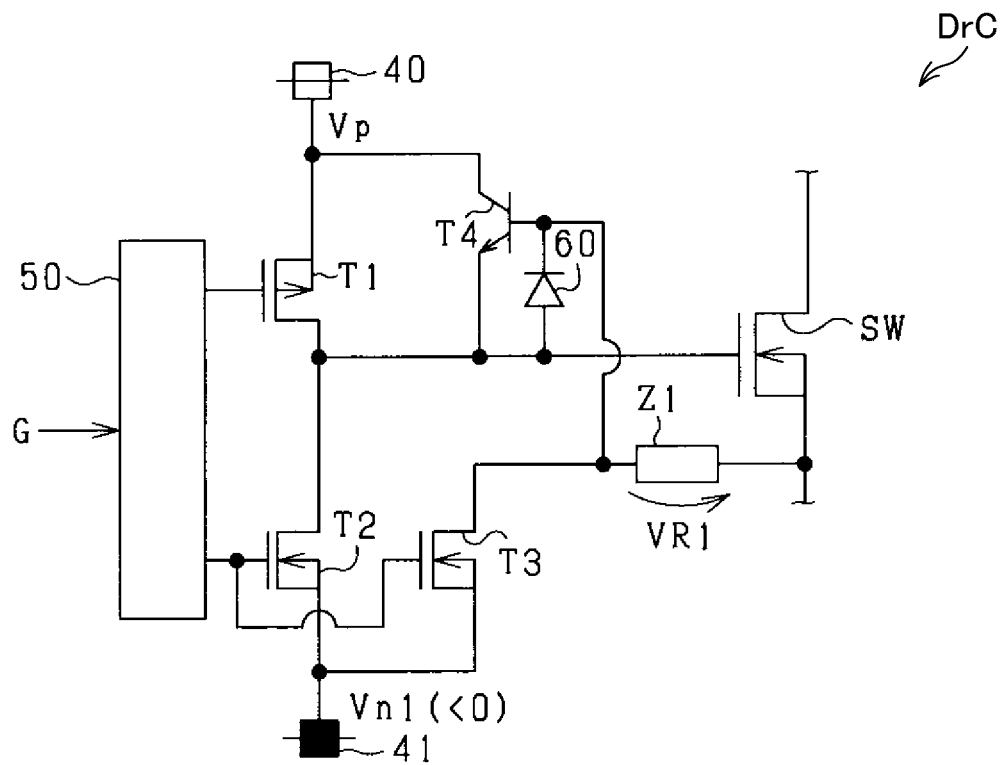
FIG. 7 is a circuit diagram schematically illustrating an example of the structure of a drive circuit for each switch according to the second embodiment of the present disclosure.

The following describes the second embodiment of the present disclosure with reference to FIG. 7. FIG. 7 schematically illustrates each drive circuit DrC according to the second embodiment. The structures and/or functions of the drive circuit DrC according to the second embodiment are different from those of the drive circuit Dr according to the first embodiment by the following points. So, the following mainly describes the different points, and omits or simplifies descriptions of like parts between the first and second embodiments, to which identical or like reference characters are assigned, thus eliminating redundant description.

The drive circuit DrC includes a protective diode 60 having an anode connected to the emitter of the fourth switch T4, and a cathode connected to the base of the fourth switch T4.

This configuration prevents the potential at the emitter of the fourth switch T4 from excessively increasing relative to the potential at the base of the fourth switch T4 while the first switch T1 is maintained in the off state and the second switch T2 is maintained in the off state. This is because the protective diode 60 enables a current to flow from the emitter to the base of the fourth switch T4.

The second embodiment therefore achieves a further benefit of protecting the fourth switch T4 against an excessive voltage in addition to the same benefits as those achieved by the first embodiment.

Third Embodiment

Figure 8:
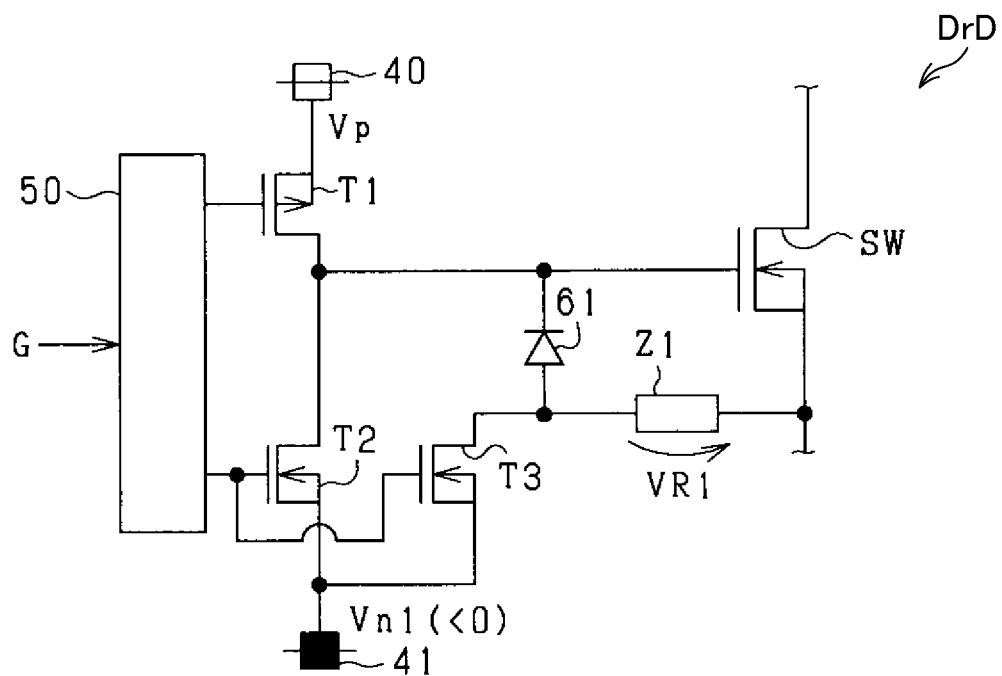
FIG. 8 is a circuit diagram schematically illustrating an example of the structure of a drive circuit for each switch according to the third embodiment of the present disclosure.

The following describes the third embodiment of the present disclosure with reference to FIG. 8. FIG. 8 schematically illustrates each drive circuit DrD according to the third embodiment. The structures and/or functions of the drive circuit DrD according to the third embodiment are different from those of the drive circuit Dr according to the first embodiment by the following points. So, the following mainly describes the different points, and omits or simplifies descriptions of like parts between the first and third embodiments, to which identical or like reference characters are assigned, thus eliminating redundant description.

The drive circuit DrD includes a diode 61 in place of the fourth switch T4. The diode 61 has an anode connected to the drain of the third switch T3 and the second connection terminal of the reference voltage generator Z1. The diode 61 has a cathode connected to the gate of the target switch SW.

The operations of each of the first to third switches T1 to T3 according to the third embodiment are substantially identical to those of the corresponding one of the first to third switches T1 to T3 according to the first embodiment.

While the first switch T1 is in the on state with the second and third switches T2 and T3 being in the off state during the period from the time t1 to the time t2 (see FIG. 8), the diode 61 works in the same manner as the reverse-biased fourth switch T4 to prevent a current from flowing from the positive voltage source 40 to the source of the target switch SW via the first switch T1 and the reference voltage generator Z1.

While the first switch T1 is in the off state with the second and third switches T2 and T3 being in the on state, the first negative voltage Vn1 of the negative power source 41 is supplied to the gate of the target switch SW (see the period from the time t2 to the time t3).

When the second and third switches T2 and T3 are switched from the on state to the off state, charge based on the reference voltage generator Z1 and the potential at the source of the target switch SW is supplied to the gate of the target switch SW until the gate voltage Vg increases up to the second negative voltage Vn2. The second negative voltage Vn2 is set to be higher than the first negative voltage Vn1 and lower than the potential at the source of the target switch SW.

The third embodiment therefore achieves a particular benefit of making it possible to apply one of the first negative voltage Vn1 and the second negative voltage Vn2 to the gate of the target switch SW based on the simpler structure of the drive circuit DrD, because the simpler structure of the diode 61 is used in place of the fourth switch T4 comprised of the bipolar transistor.

Fourth Embodiment

Figure 9:
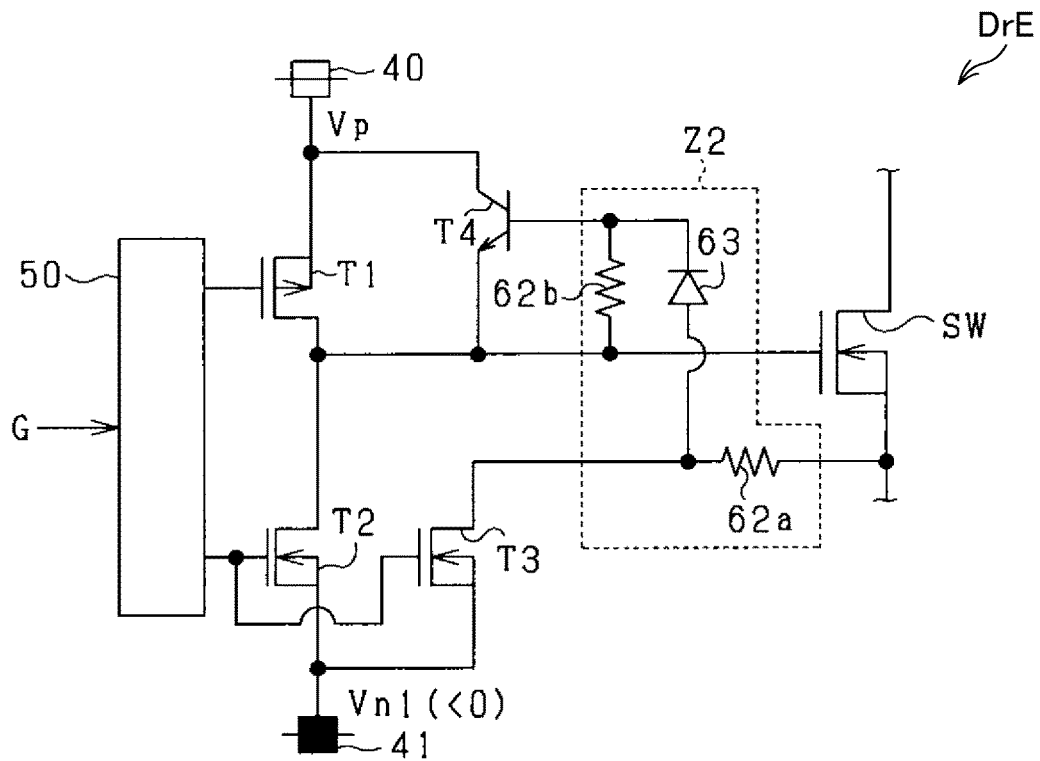
FIG. 9 is a circuit diagram schematically illustrating an example of the structure of a drive circuit for each switch according to the fourth embodiment of the present disclosure.

The following describes the fourth embodiment of the present disclosure with reference to FIG. 9. FIG. 9 schematically illustrates each drive circuit DrE according to the fourth embodiment. The structures and/or functions of the drive circuit DrE according to the fourth embodiment are different from those of the drive circuit Dr according to the first embodiment by the following points. So, the following mainly describes the different points, and omits or simplifies descriptions of like parts between the first and fourth embodiments, to which identical or like reference characters are assigned, thus eliminating redundant description.

The drive circuit DrE includes a reference voltage generator Z2, which is different from the reference voltage generator Z1 according to the first embodiment.

The reference voltage generator Z2 includes a first resistor 62a with a resistance value R1, a second resistor 62b with a resistance value R2, and a diode 63. Each of the first and second resistors 62a and 62b has opposing first and second ends. The source of the target switch SW is connected to the first end of the first resistor 62a, and the drain of the third switch T3 and the anode of the diode 63 are connected to the second end of the first resistor 62a.

The base of the fourth switch T4 and the first end of the second resistor 62b are connected to the gate of the target switch SW.

While the first switch T1 is in the on state with the second and third switches T2 and T3 being in the off state during the period from the time t1 to the time t2 (see FIG. 8), the diode 63 works in the same manner as the reverse-biased fourth switch T4 to prevent a current from flowing from the positive voltage source 40 to the source of the target switch SW via the first switch T1, the second resistor 62b, and the first resistor 61a.

Adjusting the resistance values R1 and R2 of the respective first and second resistors 62a and 62b enables the second negative voltage Vn2 to be adjusted. The second negative voltage Vn2, which is higher than the first negative voltage Vn1 and lower than 0 V, is expressed by the following equation (eq1):

$$Vn2 = -\left(2 + \frac{R1}{R2}\right)Vd \qquad (eq1)$$

where Vd represents a forward voltage of the diode 63, which is higher than 0 V.

The following describes how to develop the expression (eq1).

The gate voltage Vg of the target switch SW is expressed by the following equation (eq2) relative to a source voltage Vs of the target switch SW, which is higher than 0 V:

$$Vg = Vs - Is - R1 - Vd - Vbe(T4) \qquad (eq2)$$

where Vbe(T4) represents an emitter-base voltage of the fourth switch T4, and Is represents a current flowing through the first resistor 62a.

Transforming the equation (eq2) enables the following equation (eq3) to be derived:

$$Vn2 = Vg - Vs = -Is - R1 - Vd - Vbe(T4) \qquad (eq3)$$

Substituting the relational expressions Vbe≅Vd and Is=Vbe(T4)/R2 to the above equation (eq3) enables the above equation (eq1) to be derived.

The fourth embodiment achieves the same benefits as those achieved by the first embodiment.

Fifth Embodiment

Figure 10:
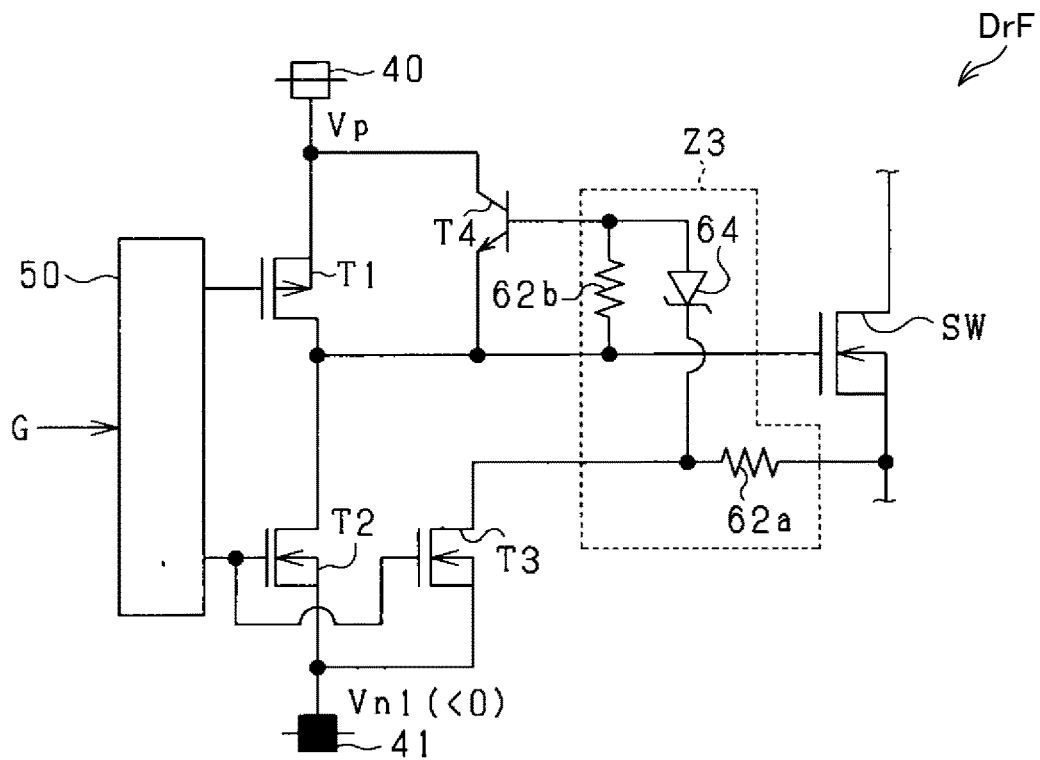
FIG. 10 is a circuit diagram schematically illustrating an example of the structure of a drive circuit for each switch according to the fifth embodiment of the present disclosure.

The following describes the fifth embodiment of the present disclosure with reference to FIG. 10. FIG. 10 schematically illustrates each drive circuit DrF according to the fifth embodiment. The structures and/or functions of the drive circuit DrF according to the fifth embodiment are different from those of the drive circuit DrE according to the fourth embodiment by the following points. So, the following mainly describes the different points, and omits or simplifies descriptions of like parts between the fourth and fifth embodiments, to which identical or like reference characters are assigned, thus eliminating redundant description.

The drive circuit DrF includes a reference voltage generator Z3, which is different from the reference voltage generator Z2 according to the fourth embodiment.

The reference voltage generator Z3 includes the first resistor 62a with the resistance value R1, the second resistor 62b with the resistance value R2, and a Zener diode 64. The first end of the second resistor 62b and the base of the fourth switch T4 are connected to the anode of the Zener diode 64. The drain of the third switch T3 and the second end of the first resistor 62a are connected to the cathode of the Zener diode 64.

The second negative voltage Vg2 according to the fifth embodiment, which is higher than the first negative voltage Vn1 and lower than 0 V, is expressed by the following equation (eq4):

$$Vn2 = \left(1 + \frac{R1}{R2}\right)Vbe(T4) - VZ \qquad (eq4)$$

where VZ represents a breakdown voltage of the Zener diode 64, which is higher than 0 V.

The following describes how to develop the expression (eq4).

The gate voltage Vg of the target switch SW is expressed by the following equation (eq5) relative to a source voltage Vs of the target switch SW, which is higher than 0 V:

$$Vg = Vs - Is - R1 - VZ - Vbe(T4) \qquad (eq5)$$

Assuming that the breakdown voltage VZ is independent from the current Is, transforming the equation (eq5) enables the following equation (eq6) to be derived:

$$Vn2 = Vg - Vs = Is - R1 - VZ - Vbe(T4) \qquad (eq6)$$

Substituting the relational expression Is=Vbe(T4)/R2 to the above equation (eq6) enables the above equation (eq4) to be derived.

Next, the following describes a specific benefit of the fourth embodiment in addition to the embodiments achieved by the first embodiment.

The base-emitter voltage Vbe(T4) of the fourth switch T4 has temperature dependence. Specifically, the higher the temperature of the fourth switch T4 is, the lower the base-emitter voltage Vbe(T4) is. In contrast, the breakdown voltage VZ of the Zener diode 64 switch T4 has temperature dependence that, the higher the temperature of the Zener diode 64 is, the lower the higher the breakdown voltage VZ of the Zener diode 64 is. That is, the temperature dependence of the breakdown voltage VZ of the Zener diode 64 enables change of the value (VZ+Vbe(T4)) depending on change in temperature of the fourth switch T4 and the Zener diode 64 to be reduced. This therefore results in an improvement of the temperature dependence of the second negative voltage Vn2, making it possible to improve the accuracy of adjusting the second negative voltage Vn2 based on the resistances R1 and R2 of the respective first and second resistors 62a and 62b.

Sixth Embodiment

Figure 11:
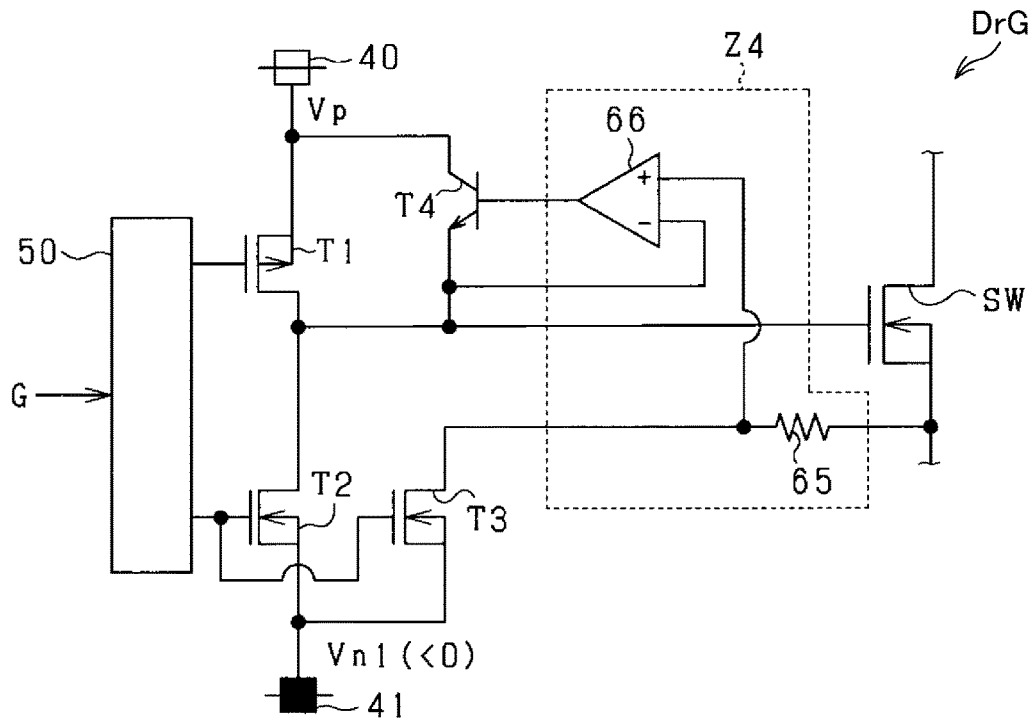
FIG. 11 is a circuit diagram schematically illustrating an example of the structure of a drive circuit for each switch according to the sixth embodiment of the present disclosure.

The following describes the sixth embodiment of the present disclosure with reference to FIG. 11. FIG. 11 schematically illustrates each drive circuit DrG according to the sixth embodiment. The structures and/or functions of the drive circuit DrG according to the sixth embodiment are different from those of the drive circuit Dr according to the first embodiment by the following points. So, the following mainly describes the different points, and omits or simplifies descriptions of like parts between the first and sixth embodiments, to which identical or like reference characters are assigned, thus eliminating redundant description.

The drive circuit DrG includes a reference voltage generator Z4, which is different from the reference voltage generator Z1 according to the first embodiment.

The reference voltage generator Z4 includes a resistor 65 and an amplifier 66; the amplifier 66 has a non-inverting input terminal, an inverting input terminal, and an output terminal. The resistor 65 has opposing first and second ends. The source of the target switch SW is connected to the first end of the resistor 65, and the drain of the third switch T3 and the non-inverting input terminal of the amplifier 66 are connected to the second end of the resistor 65.

The emitter of the fourth switch T4 is connected to the inverting input terminal of the amplifier 66. The base of the fourth switch T4 is connected to the output terminal of the amplifier 66.

This configuration of the drive circuit DrG causes the amplifier 66 to operate in a negative feedback mode to adjust the potential at the emitter of the fourth switch T4 to be equal to the potential at the non-inverting input terminal of the amplifier 66. This eliminates, from the second negative voltage Vn2, adverse effects of the base-emitter voltage of the fourth switch T4. This enables the second negative voltage Vn2 to be closer to 0 V, resulting in the second negative voltage Vn2 being higher than the second negative voltage Vn2 of the first embodiment. This therefore achieves, in addition to the benefits achieved by the first embodiment, a benefit of efficiently delaying the deterioration of the target switch SW.

Seventh Embodiment

Figure 12:
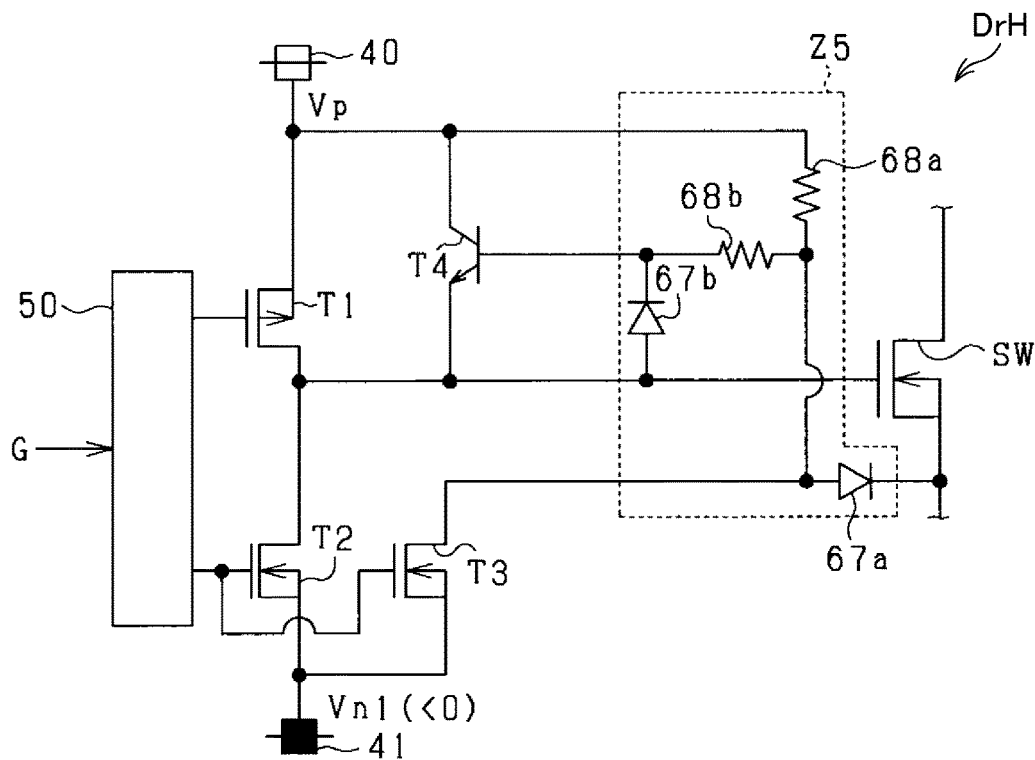
FIG. 12 is a circuit diagram schematically illustrating an example of the structure of a drive circuit for each switch according to the seventh embodiment of the present disclosure.

The following describes the seventh embodiment of the present disclosure with reference to FIG. 12. FIG. 12 schematically illustrates each drive circuit DrH according to the seventh embodiment. The structures and/or functions of the drive circuit DrH according to the seventh embodiment are different from those of the drive circuit DrG according to the sixth embodiment by the following points. So, the following mainly describes the different points, and omits or simplifies descriptions of like parts between the sixth and seventh embodiments, to which identical or like reference characters are assigned, thus eliminating redundant description.

The drive circuit DrH includes a reference voltage generator Z5 that has a simpler configuration as compared with the reference voltage generator Z4; the reference voltage generator Z5 is configured to adjust the second negative voltage Vn2 to be closer to 0 V.

The reference voltage generator Z5 includes a first diode 67a, a second diode 67b, a first resistor 68a, and a second resistor 68b. Each of the first and second resistors 68a and 68b has opposing first and second ends. The source of the target switch SW is connected to the cathode of the first diode 67a, and the drain of the third switch T3 and the first end of each of the first and second resistors 68a and 68b are connected to the anode of the first diode 67a. The collector of the fourth switch T4 and the positive voltage source 40 are connected to the second end of the first resistor 68a.

The base of the fourth switch T4 and the anode of the second diode 67b are connected to the second end of the second resistor 68b, and the gate of the target switch SW is connected to the cathode of the second diode 67b.

When the second and third switches T2 and T3 are switched from the on state to the off state (see FIG. 3), the anode potential of the first diode 67a increases to be higher by a predetermined potential difference than the cathode potential of the first diode 67a. On the other hand, the second diode 67b causes the emitter potential of the fourth switch T4 to be lower than the predetermined potential difference than the base potential of the fourth switch T4.

That is, in an electrical rout from source of the target switch SW to the gate of the target switch SW via the first diode 67a, the second resistor 68b, and the second diode 68b, the emitter voltage of the fourth switch T4, which serves as the gate potential of the target switch SW, is lower than the base voltage of thereof by the predetermined potential difference, and the base voltage of the fourth switch T4 is higher than the cathode potential of the first diode 67a; the cathode potential is 0 V.

This therefore enables the second negative voltage Vn2 to be closer to 0 V using the simpler structure of the reference voltage generator Z5 as compared with the structure of the reference voltage generator Z4 according to the sixth embodiment in addition to the benefits achieved by the sixth embodiment.

Eighth Embodiment

The following describes the eighth embodiment of the present disclosure with reference to FIG. 13 and FIG. 14. FIG. 13 schematically illustrates each drive circuit DrI according to the eighth embodiment. The structures and/or functions of the drive circuit DrI according to the eighth embodiment are different from those of the drive circuit Dr according to the first embodiment by the following points. So, the following mainly describes the different points, and omits or simplifies descriptions of like parts between the first and eighth embodiments, to which identical or like reference characters are assigned, thus eliminating redundant description.

The drive circuit DrI includes an off-holding diode 70 and an off-holding switch Toff; these off-holding diode 70 and off-holding switch Toff serves as an off-holding circuit. The eighth embodiment uses an N-channel MOSFET as the off-holding switch Toff, and the gate of the off-holding switch Toff is connected to the drive controller 50, so that the drive controller 50 controls on-off switching operations of the off-holding switch Toff.

The anode of the off-holding diode 70 is connected to the gate of the target switch SW, and the drain of the off-holding switch Toff is connected to the cathode of the off-holding diode 70. The source of the target switch SW is connected to the source of the off-holding switch Toff.

While the first switch T1 is in the off state with the second and third switches T2 and T3 being in the on state, the off-holding diode 70 prevents a current from flowing from the source of the target switch SW to the negative voltage source 41 via the intrinsic diode of the off-holding switch Toff and the second switch T2.

Note that the location of the off-holding diode 70 and location of the off-holding switch Toff can be reversed from each other. Specifically, the cathode of the off-holding diode 70 can be connected to the source of the target switch SW, and the anode of the off-holding diode 70 can be connected to the source of the off-holding switch Toff. The drain of the off-holding switch Toff can be connected to the gate of the target switch SW.

The following describes a drive routine of the target switch SW carried out by the drive controller 50 according to the eighth embodiment with reference to FIGS. 14A to 14F. FIGS. 14A to 14E respectively correspond to FIGS. 3A to 3E, and FIG. 14F illustrates how the off-holding switch Toff is driven over time.

Upon determining that the drive signal G is the on command at the time t1, the drive controller 50 performs a charging task to thereby turn on the first switch T1 while maintaining off the second and third switches T2 and T3. At the time t1, the drive controller 50 also turns on the off-holding switch Toff, and maintains the off-holding switch Toff in the off state during the period from the time t1 to the time t3.

When the predetermined time Td has elapsed at the time t3 since the timing t2 at which the drive signal G was turned from the on command to the off command, the drive controller 50 synchronously switches the second and third switches T2 and T3 from the on state to the off state.

At the time t3, the drive controller 50 also switches the off-holding switch Toff from the off state to the on state, and maintains the off-holding switch Toff during the period from the time t3 to the time t4 corresponding to the rising timing of the drive signal G.

That is, the on-state of the off-holding switch Toff while all the first to third target switches T1 to T3 are in the off state during the period from the time t3 to the time t4 enables the gate voltage Vg of the target switch SW to be maintained at a clamp voltage $V_{clamp}$ that is close to the source potential of the target switch SW. Note that the clamp voltage $V_{clamp}$ is defined based on the sum of a positive voltage drop Von across the off-holding switch Toff and a positive voltage drop Vf across the off-holding diode 70.

As described above, the drive circuit DrI is configured to maintain the gate voltage Vg of the target switch SW at the clamp voltage $V_{clamp}$ even if unexpected charge is supplied to the gate of the target switch SW due to any cause after the time t3 at which the second and third switches T2 and T3 are switched off (see the dashed line in FIG. 14B). This therefore prevents erroneous turn-on of the target switch SW in addition to the same benefits as those achieved by the first embodiment.

First Modification of the Eighth Embodiment

Figure 15:
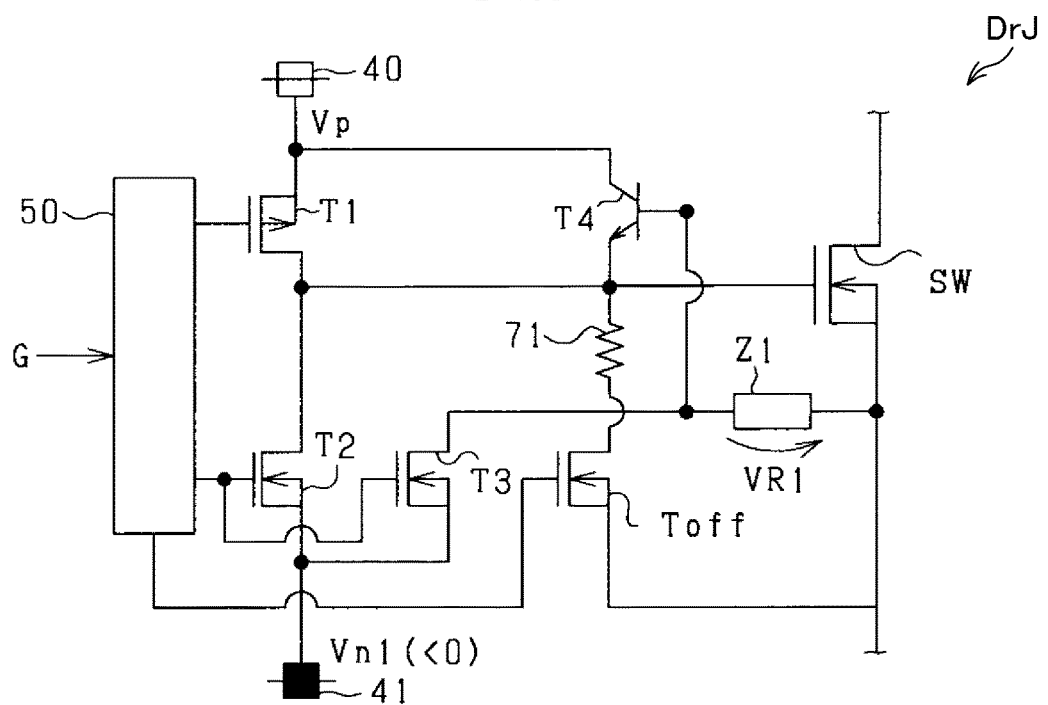
FIG. 15 is a circuit diagram schematically illustrating an example of the structure of a drive circuit for each switch according to a first modification of the eighth embodiment.

The following describes a first modification of the eighth embodiment. FIG. 15 schematically illustrates each drive circuit DrJ according to the first modification of the eighth embodiment. The structures and/or functions of the drive circuit DrJ according to the first modification are different from those of the drive circuit DrI according to the eighth embodiment by the following points. So, the following mainly describes the different points, and omits or simplifies descriptions of like parts between the eighth embodiment and its first modification, to which identical or like reference characters are assigned, thus eliminating redundant description.

The drive circuit DrJ according to the first modification includes an off-holding resistor 71 in place of the off-holding diode 70. That is, the off-holding resistor 71 has opposing first and second ends. The first end of the off-holding resistor 71 is connected to the gate of the target switch SW, and the drain of the off-holding switch Toff is connected to the second end of the off-holding resistor 71.

The drive circuit DrJ is configured to maintain the gate voltage Vg of the target switch SW at the clamp voltage $V_{clamp}$ that is defined based on the positive voltage drop Von across the off-holding switch Toff.

This configuration therefore makes it possible to set the clamp voltage $V_{clamp}$ to be lower than the clamp voltage according to the eight embodiment, thus more reliably preventing erroneous turn-on of the target switch SW in addition to the same benefits as those achieved by the first embodiment.

As a second modification of the eighth embodiment, the off-holding switch Toff can be maintained in the off state during the period from the time t3 to the time t4.

Ninth Embodiment

Figure 16:
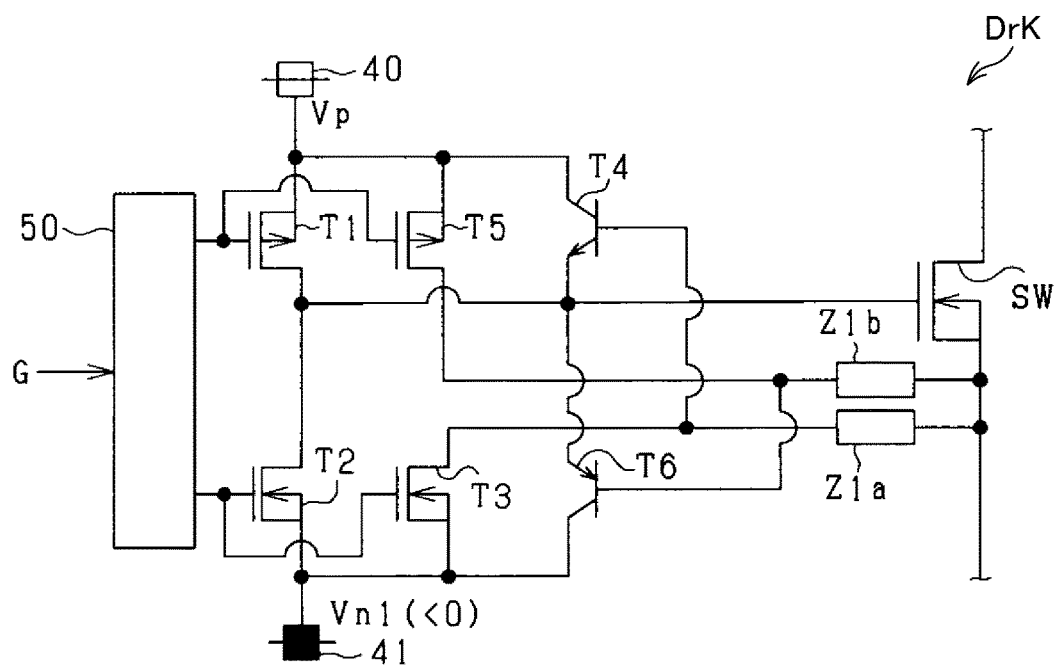
FIG. 16 is a circuit diagram schematically illustrating an example of the structure of a drive circuit for each switch according to the ninth embodiment of the present disclosure.

The following describes the ninth embodiment of the present disclosure with reference to FIGS. 16 and 17. FIG. 16 schematically illustrates each drive circuit DrK according to the ninth embodiment, whose off-holding circuit is different from the off-holding circuit of the eighth embodiment. The structures and/or functions of the drive circuit DrK according to the ninth embodiment are different from those of the drive circuit Dr according to the eighth embodiment by the following points. So, the following mainly describes the different points, and omits or simplifies descriptions of like parts between the eighth and ninth embodiments, to which identical or like reference characters are assigned, thus eliminating redundant description. Note that the reference voltage generator Z1 according to the ninth embodiment will be referred to as a first reference voltage generator Z1a.

The drive circuit DrK includes a fifth switch Tr serving as a first off-holding switch, and a sixth switch T6 serving as a second off-holding switch. The ninth embodiment uses a P-channel MOSFET as the fifth switch T5, and a PNP transistor as the sixth switch T6. The drive controller 50 is programmed to drive the fifth switch T5 in synchronization with the first switch T1.

The drive circuit DrK also includes a second reference voltage generator Z1b having opposing first and second ends.

The positive power source 40 is connected to the source of the fifth switch T5. The source of the target switch SW is connected to the first end of the second reference voltage generator Z1b. The second end of the second reference voltage generator Z1b and the base of the sixth switch T6 are connected to the drain of the fifth switch T5. The gate of the target switch SW is connected to the emitter of the sixth switch T6, and the negative voltage source 41 is connected to the collector of the sixth switch T6. The sixth switch T6 is configured to clamp the gate voltage Vg of the target switch SW based on a second reference voltage V(Z2) generated by the second reference voltage generator Z1b.

The second reference voltage generator Z1b is configured to generate the second reference voltage that is higher than the source potential of the target switch SW and lower than the threshold voltage Vth. The second reference voltage generator Z1b includes, for example, a diode or a Zener diode. If the second reference voltage generator Z1b is comprised of a diode or a Zener diode, the cathode of the diode or Zener diode is connected to the source of the target switch SW, and the anode of the diode or Zener diode is connected to both the drain of the fifth switch T5 and the base of the sixth switch T6.

Figure 17A:
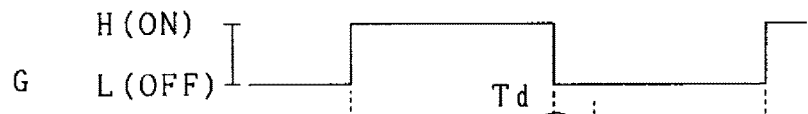
FIGS. 17A to 17F are a joint timing chart schematically illustrating a drive routine of a target switch according to the ninth embodiment.
Figure 17B:
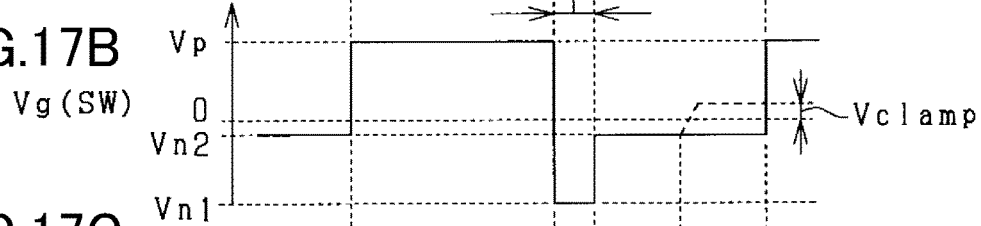
Figure 17C:
Figure 17D:
Figure 17E:
Figure 17F:

The following describes a drive routine of the target switch SW carried out by the drive controller 50 according to the ninth embodiment with reference to FIGS. 17A to 17F. FIG. 17C shows how each of the first and fifth switches T1 and T5 is driven over time, and FIG. 17F illustrates how the sixth switch T6 is driven over time. FIGS. 17A, 17B, 17D, and 17E respectively correspond to FIGS. 3A, 3B, 3D, and 3E.

FIGS. 17B and 17F shows that unexpected charge is supplied to the gate of the target switch SW at time t4, so that the sixth switch T6 is switched from the off state to the on state (see the dashed lines in FIGS. 17B and 17F). The on-state sixth switch T6 enables a clamp voltage $V_{clamp}$ to be supplied to the gate of the target switch SW from the second reference voltage generator Z1b. The clamp voltage $V_{clamp}$ according to the ninth embodiment is determined based on the sum of the second reference voltage output from the second reference voltage generator Z1b and the base-emitter voltage of the sixth switch T6.

As described above, the drive circuit DrK according to the ninth embodiment DrK is configured to maintain the gate voltage Vg of the target switch SW at the clamp voltage $V_{clamp}$ even if unexpected charge is supplied to the gate of the target switch SW due to any cause after the time t3 at which the second and third switches T2 and T3 are switched off (see the dashed line in FIGS. 17B and 17F). This therefore prevents erroneous turn-on of the target switch SW in addition to the same benefits as those achieved by the first embodiment.

The drive circuit DrK is also capable of adjusting the second reference voltage, thus adjusting the clamp voltage $V_{clamp}$.

In the ninth embodiment, a negative value of an output voltage V(Z1), i.e. the reference voltage Vref, of the first reference voltage generator Z1 at the second connection terminal thereof and a value of the output voltage, i.e. the second reference voltage, V(Z2), of the second reference voltage generator Z1b are set to prevent the fourth and sixth switches T4 and T6 from being simultaneously turned on.

The following describes how to set the value of the output voltage V(Z1) of the first reference voltage generator Z1 at the second connection terminal thereof and the output voltage V(Z2) of the second reference voltage generator Z1b.

The second negative voltage Vn2 is expressed by the following equation (eq7) based on a voltage drop Vc across the third switch T3:

$$Vn2=V(Z1)-Vc=Vg \quad (eq7)$$

where Vg represents the gate voltage of the target switch SW.

A requirement for the sixth switch T6 being maintained in the off state is expressed by the following equation (eq8):

$$Vbe(T6)=Vg-V(Z2)<Vk \quad (eq8)$$

where Vbe(T6) represents the base-emitter voltage of the sixth switch T6, and Vk represents the base-emitter voltage of the sixth switch T6 while the sixth switch T6 is in the on state.

These equations (eq7) and (eq8) enables the following equation (eq9) to be developed:

$$V(Z2)>V(Z1)-Vc-Vk \quad (eq9)$$

On the other hand, the clamp voltage $V_{clamp}$ is required to satisfy the following condition expressed by the following equation (eq10) for preventing the target switch SW from being erroneously turned on due to unexpected charge being supplied to the gate of the target switch SW:

$$V_{clamp}=V(Z2)+Vk<Vth \quad (eq10)$$

where Vth represents the threshold voltage of the target switch SW.

The value of the output voltage V(Z2) is therefore set to satisfy both the equations (eq9) and (eq10).

The drive circuit DrK according to the ninth embodiment therefore achieves the same benefits as those achieved by the eighth embodiment.

Tenth Embodiment

Figure 18:
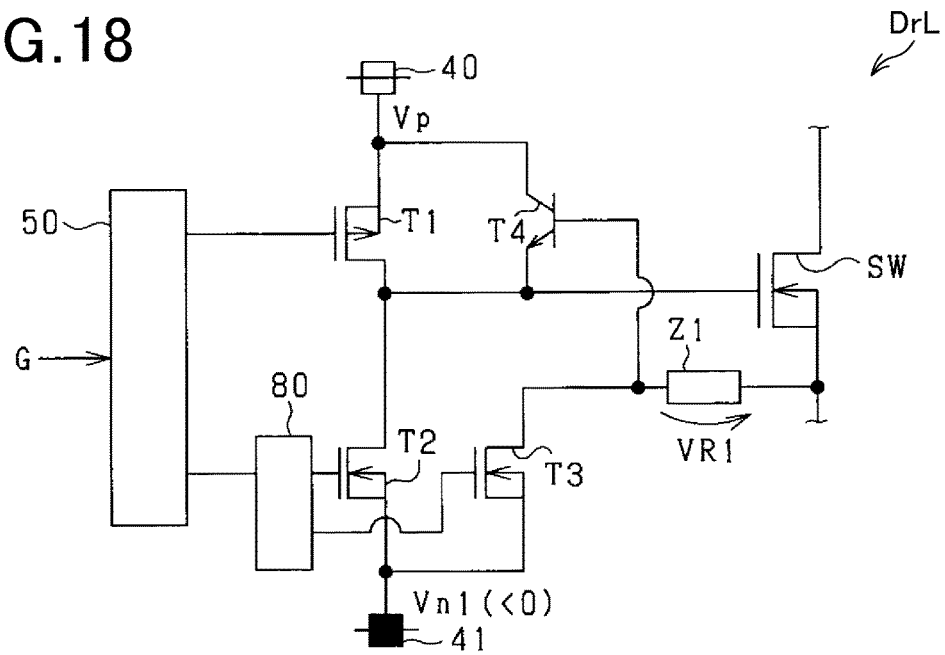
FIG. 18 is a circuit diagram schematically illustrating an example of the structure of a drive circuit for each switch according to the tenth embodiment of the present disclosure.

The following describes the tenth embodiment of the present disclosure with reference to FIG. 18 and FIG. 19. FIG. 18 schematically illustrates each drive circuit DrL according to the tenth embodiment. The structures and/or functions of the drive circuit DrL according to the tenth embodiment are different from those of the drive circuit Dr according to the first embodiment by the following points. So, the following mainly describes the different points, and omits or simplifies descriptions of like parts between the first and tenth embodiments, to which identical or like reference characters are assigned, thus eliminating redundant description.

The drive circuit DrL is configured to prevent the fourth and second switches T4 and T2 from being simultaneously turned on.

Specifically, the drive circuit DrL includes a delay generator 80 that shifts, i.e. delays, the on timing and/or off timing of each of the second switch T2 and the third switch T3.

The following describes a drive routine of the target switch SW carried out by the drive controller 50 according to the tenth embodiment with reference to FIGS. 19A to 19H. FIG. 19F illustrates how the base potential, referred to as Vb(T4) of the fourth switch T4 changes over time, and FIG. 19G illustrates how the emitter potential, referred to as Ve(T4) of the fourth switch T4 changes over time. In addition, FIG. 19H illustrates how the base-emitter voltage Vbe(T4) of the fourth switch T4 changes over time. FIGS. 19A to 19E respectively correspond to FIGS. 3A to 3E. Note that the scale of the horizontal time axis of FIG. 19 is enlarged as compared with the horizontal time scale of FIG. 3.

When the drive signal G sent from the controller 100 is changed from the on command to the off command at time t21, the drive controller 50 sends an off instruction to the first switch T1 and on instruction to the third switch T3, thus synchronously turning off the first switch T1 and turning on the third switch T3.

In response to the on instruction sent from the drive controller 50 at the time t21, the delay generator 80 delays turning on of the second switch T2 by a predetermined time, and turns on the second switch T2 at time t22. This maintains the fourth switch T4 in the reverse-biased state, thus preventing the second and fourth switches T2 and T4 from being simultaneously turned on, thus preventing a flow-through current from flowing from the positive voltage source 40 to the negative voltage source 41.

At the time t23, the drive controller 50 sends an off instruction to the second switch T2, thus turning off the second switch T2. In response to the off instruction sent from the drive controller 50 at the time t23, the delay generator 80 delays turning off of the third switch T3 by a predetermined time, and turns off the third switch T3 at time t24. This prevents the second and fourth switches T2 and T4 from being simultaneously turned on, thus preventing a flow-through current from flowing from the positive voltage source 40 to the negative voltage source 41. Note that FIG. 19E shows that the fourth switch t4 is in the on state from the time t24 to time t25.

As described above, the drive circuit DrL prevents the second and fourth switches T2 and T4 from being simultaneously turned on, thus preventing a flow-through current from flowing from the positive voltage source 40 to the negative voltage source 41, in addition to the same benefits as those achieved by the first embodiment.

Eleventh Embodiment

Figure 20:
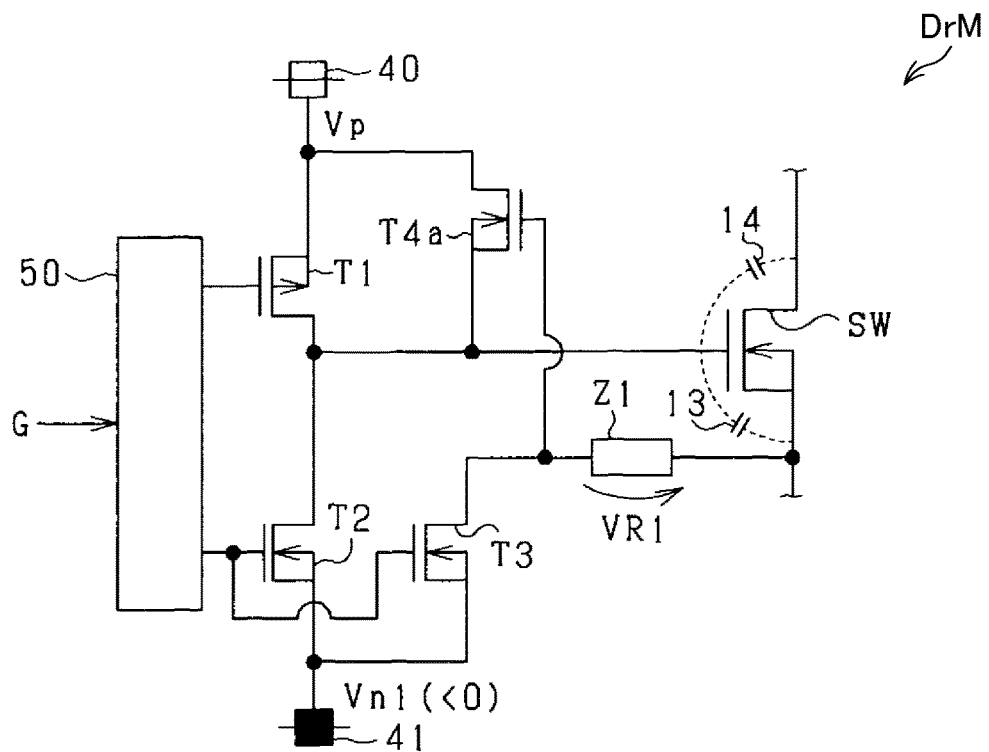
FIG. 20 is a circuit diagram schematically illustrating an example of the structure of a drive circuit for each switch according to the eleventh embodiment of the present disclosure.

The following describes the eleventh embodiment of the present disclosure with reference to FIG. 20. FIG. 20 schematically illustrates each drive circuit DrM according to the eleventh embodiment. The structures and/or functions of the drive circuit DrM according to the eleventh embodiment are different from those of the drive circuit Dr according to the first embodiment by the following points. So, the following mainly describes the different points, and omits or simplifies descriptions of like parts between the first and eleventh embodiments, to which identical or like reference characters are assigned, thus eliminating redundant description.

The drive circuit DrM includes a monopolar switch, such as an N-channel MOSFET, as a fourth switch T4a in place of a bipolar transistor.

Specifically, the positive voltage source 40 is connected to the source of the fourth switch T4a, and the gate of the target switch SW is connected to the drain of the fourth switch T4a. The second connection terminal of the reference voltage generator Z1 is connected to the gate of the fourth switch T4a. The drain of the fourth switch T4a serves as, for example, a first sub terminal, and the source of the fourth switch T4a serves as, for example, a second sub terminal, and the gate of the fourth switch T4a serves as, for example, a sub control terminal.

The operations of each of the first to third switches T1 to T3 according to the eleventh embodiment are substantially identical to those of the corresponding one of the first to third switches T1 to T3 according to the first embodiment. Because the drive circuit DrM has the identical configuration of the drive circuit Dr according to the first embodiment, the eleventh embodiment achieves the same benefits as those achieved by the first embodiment.

Figure 21:
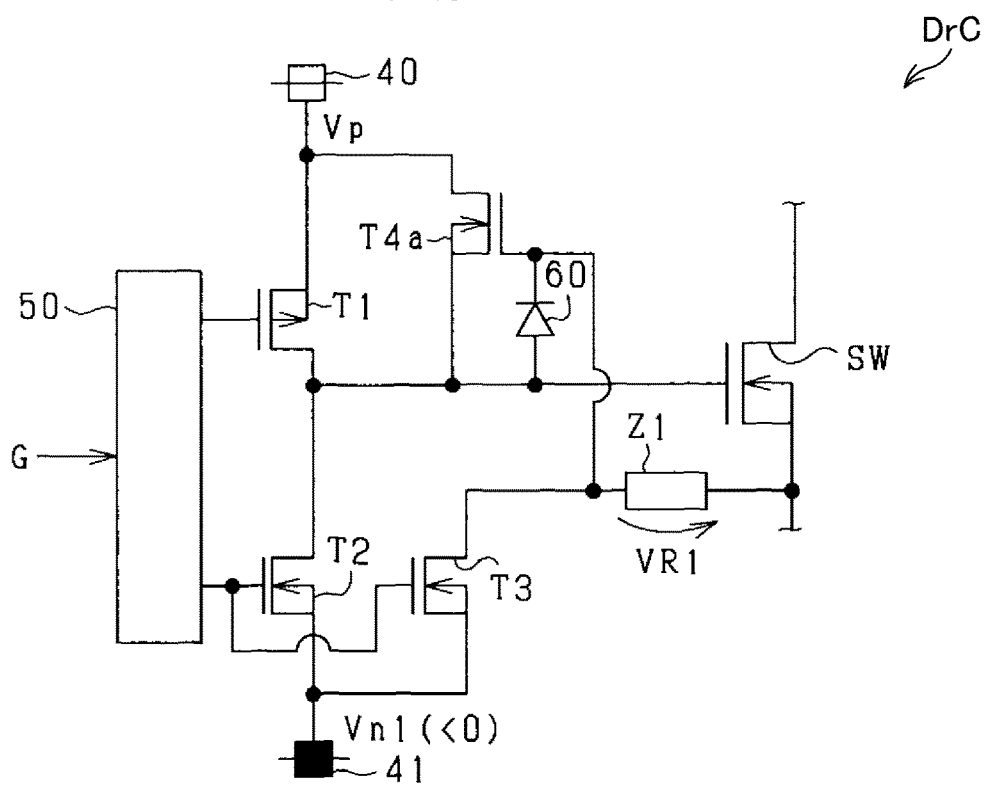
FIG. 21 is a circuit diagram schematically illustrating an example of the structure of a drive circuit for each switch according to a modification of the second embodiment.

As a modification of the second embodiment illustrated in FIG. 7, a monopolar switch, such as an N-channel MOSFET, can be used as a fourth switch T4a in place of a bipolar transistor (see FIG. 21).

Modifications

The present disclosure is not limited to the above embodiments, and therefore the above embodiments can be freely combined with each other or variably modified within the scope of the present disclosure.

In FIG. 2, a resistor can be used as the reference voltage generator Z1.

In the ninth embodiment, monopolar switches can be used as the respective fourth and sixth switches T4 and T6. For example, an N-channel MOSFET illustrated in FIG. 20 can be used as the fourth switch T4, and a P-channel MOSFET can be used as the sixth switch T6. Specifically, the source of the P-channel MOSFET is connected to the gate of the target switch SW, and the drain of the P-channel MOSFET is connected to the negative voltage source 41.

Other types of switches, such as IGBTs, can be used as the target switches SW. If an IGBT is used as each of the switches SW, the collector serves as a first main terminal, the emitter serves as a second main terminal, and the gate serves as a main control terminal.

Power converters comprised of the switches SW are not limited to three-phase power converters, and the present disclosure can be applied to multiphase power converters.

While the illustrative embodiments of the present disclosure have been described herein, the present disclosure is not limited to the embodiments described herein, but includes any and all embodiments having modifications, omissions, combinations (e.g., of aspects across various embodiments), adaptations and/or alternations as would be appreciated by those in the art based on the present disclosure. The limitations in the claims are to be interpreted broadly based on the language employed in the claims and not limited to examples described in the present specification or during the prosecution of the application, which examples are to be construed as non-exclusive.

What is claimed is:

1. A drive circuit for turning on or off a target switch having a first main terminal, a second main terminal with a voltage, and a main control terminal, the drive circuit comprising:
    a negative power source configured to output a first negative voltage that is lower than the voltage at the second main terminal;
    a discharge switch electrically connected between the main control terminal and the negative voltage source;
    a reference voltage generator connected to the second main terminal and configured to generate, based on the voltage at the second main terminal, a reference voltage that is higher than the first negative output voltage of the negative power source and that is lower than the voltage at the second main terminal;
    a control switch electrically connected between the negative voltage source and the reference voltage generator; and
    a drive controller configured to:
        switch the discharge switch and the control switch from an off state to an on state to thereby supply the first negative output voltage to the main control terminal of the target switch; and
        switch the discharge switch and the control switch from the on state to the off state to thereby change the first negative output voltage to be supplied to the main control terminal of the target switch to a second negative voltage based on the reference voltage generated by the reference voltage generator, the second negative voltage being more positive than the first negative voltage.

2. The drive circuit according to claim 1, further comprising:
    a positive voltage source having a positive output voltage higher than a threshold voltage of the target switch;
    a charge switch electrically connected between the main control terminal and the positive voltage source; and
    a supply switch having a first sub terminal, a second sub terminal, and a sub control terminal, the first sub terminal being electrically connected to the positive voltage source, the second sub terminal being electrically connected to the main control terminal, the supply switch being arranged such that the reference voltage generated by the reference voltage generator is supplied to the sub control terminal thereof.

3. The drive circuit according to claim 2, wherein:
    the supply switch comprises an NPN bipolar transistor, the NPN bipolar transistor having:

a collector that is the first sub terminal;
an emitter that is the second sub terminal; and
a base that is the sub control terminal.

4. The drive circuit according to claim 2, wherein:
the control switch has a first terminal connected to the negative voltage source, and a second terminal connected to the reference voltage generator; and
the reference voltage generator comprises:
  a diode having an anode and a cathode, the cathode being electrically connected to the second main terminal, the anode being electrically connected to the second terminal of the control switch; and
  a resistor having opposing first and second ends, the first end of the resistor being electrically connected to both the anode of the diode and the sub control terminal, the second end of the resistor being electrically connected to the positive voltage source.

5. The drive circuit according to claim 2, wherein:
the supply switch comprises an N-channel MOSFET, the N-channel MOSFET having:
  a drain that is the first sub terminal;
  a source that is the second sub terminal; and
  a gate that is the sub control terminal.

6. The drive circuit according to claim 2, wherein:
the reference voltage generator has a first connection terminal electrically connected to the second main terminal, and a second connection terminal, the reference voltage generator being configured to generate a reference voltage that is more positive than the first negative voltage of the negative voltage source.

7. The drive circuit according to claim 2, wherein:
the control switch has a first terminal connected to the negative voltage source, and a second terminal connected to the reference voltage generator; and
the reference voltage generator comprises:
  a first resistor having opposing first and second ends, the first end of the first resistor being connected to the second main terminal, the second end of the first resistor being connected to the second end of the control switch;
  a diode having an anode and a cathode, the anode being connected to the second end of the first resistor, the cathode being connected to the sub control terminal; and
  a second resistor electrically connected between the sub control terminal and the second sub terminal.

8. The drive circuit according to claim 2, wherein:
the control switch has a first terminal connected to the negative voltage source, and a second terminal connected to the reference voltage generator; and
the reference voltage generator comprises:
  a first resistor having opposing first and second ends, the first end of the first resistor being connected to the second main terminal, the second end of the first resistor being connected to the second end of the control switch;
  a Zener diode having an anode and a cathode, the anode being connected to the sub control terminal, the cathode being connected to the second end of the first resistor; and
  a second resistor electrically connected between the sub control terminal and the second sub terminal.

9. The drive circuit according to claim 2, wherein:
the control switch has a first terminal connected to the negative voltage source, and a second terminal connected to the reference voltage generator; and
the reference voltage generator comprises:
  a resistor having opposing first and second ends, the first end of the resistor being connected to the second main terminal, the second end of the resistor being connected to the second end of the control switch; and
  an amplifier having a non-inverting input terminal, an inverting input terminal, and an output terminal, the non-inverting input terminal of the amplifier being connected to the second end of the resistor, the inverting input terminal of the amplifier being connected to the second sub terminal, and the output terminal of the amplifier being connected to the sub control terminal.

10. The drive circuit according to claim 2, further comprising:
a protective diode having an anode and a cathode, the anode of the protective diode being connected to the second sub terminal, the cathode of the protective diode being connected to the sub control terminal.

11. The drive circuit according to claim 1, further comprising: a supply switch including a diode having an anode and a cathode, the anode being connected to the control switch, the cathode being connected to the main control terminal.

12. The drive circuit according to claim 2, wherein: the drive controller is configured to:
switch the supply switch from an off state to an on state;
switch the discharge switch from the off state to the on state after the supply switch is switched from the off state to the on state;
switch the discharge switch from the on state to the off state; and
switch the supply switch from the on state to the off state after the discharge switch is switched from the on state to the off state.

13. The drive circuit according to claim 1, further comprising:
an off-holding circuit configured to electrically connect between the main control terminal and the second main terminal within at least a part of a period for which the target switch has been switched from the on state to the off state since the target switch was switched from the on state to the off state.

14. The drive circuit according to claim 13, wherein:
the off-holding circuit comprises:
  a series circuit comprising:
    one of an off-holding resistor and an off-holding diode having an anode and a cathode; and
    an off-holding switch being connected in series to the at least one of the off-holding diode and the off-holding resistor between the main control terminal and the second main terminal, if the off-holding diode is connected in series to the off-holding circuit, the anode of the off-holding diode being connected to the main control terminal, the cathode of the off-holding diode being connected to the off-holding switch.

15. The drive circuit according to claim 2, wherein:
the reference voltage generator is referred to as a first reference voltage generator, and the reference voltage generated by the first reference voltage generator is referred to as a first reference voltage,
the drive circuit further comprising:
  a second reference voltage generator having first and second terminals, the first terminal of the second reference voltage generator being electrically connected to the second main terminal, the second reference voltage generator being configured to generate, based on the voltage at the second main terminal, a second reference voltage that is lower than the threshold voltage;
a first off-holding switch electrically connected between the positive voltage source and the second terminal of the second reference voltage generator; and
a second off-holding switch comprised of a PNP bipolar transistor having an emitter, a collector, and a base, the emitter being electrically connected to the main control terminal, the collector being electrically connected to the negative voltage source, the base being electrically connected to the second end of the second reference voltage generator.

* * * * *